(12) United States Patent
Guan

(10) Patent No.: US 12,527,160 B2
(45) Date of Patent: Jan. 13, 2026

(54) DISPLAY SUBSTRATE WITH STACKED ACTIVE DEVICES, METHOD FOR MANUFACTURING THE DISPLAY SUBSTRATE, AND DISPLAY APPARATUS COMPRISING THE DISPLAY SUBSTRATE

(71) Applicant: BOE TECHNOLOGY GROUP CO., LTD., Beijing (CN)

(72) Inventor: Feng Guan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 438 days.

(21) Appl. No.: 18/017,642

(22) PCT Filed: Jan. 28, 2022

(86) PCT No.: PCT/CN2022/074526
§ 371 (c)(1),
(2) Date: Jan. 23, 2023

(87) PCT Pub. No.: WO2023/141921
PCT Pub. Date: Aug. 3, 2023

(65) Prior Publication Data
US 2024/0251598 A1    Jul. 25, 2024

(51) Int. Cl.
*H10K 59/121* (2023.01)
*H10K 59/12* (2023.01)

(52) U.S. Cl.
CPC ..... *H10K 59/1213* (2023.02); *H10K 59/1201* (2023.02)

(58) Field of Classification Search
CPC ............. H10K 59/1213; H10K 59/1201
(Continued)

(56) References Cited

U.S. PATENT DOCUMENTS

| 6,614,054 B1 | 9/2003 | Ahn |
| 6,900,462 B2 * | 5/2005 | Suzawa ............ H01L 21/76801 |
| | | 257/E21.252 |

(Continued)

FOREIGN PATENT DOCUMENTS

| CN | 104934372 A | 9/2015 |
| CN | 107193144 A | 9/2017 |

(Continued)

*Primary Examiner* — Eric W Jones
(74) *Attorney, Agent, or Firm* — HOUTTEMAN LAW LLC

(57) ABSTRACT

A display substrate is provided to include a base substrate and: a first transistor layer including a first active layer and a second transistor layer including a second active layer sequentially along a direction away from the base substrate; the first and second active layers are provided with at least one insulating layer therebetween, and are made of low-temperature polysilicon materials; the first active layer includes first channel region(s) and first source-drain doped region(s); the second active layer includes second channel region(s) and second source-drain doped region(s); orthographic projections of a second source-drain doped region and a first source-drain doped region on the base substrate overlap with each other; and a second source-drain doped region is connected to a first source-drain doped region through a connecting part filled in a corresponding first via in the insulating layer. A method for manufacturing a display substrate and a display apparatus are provided.

20 Claims, 16 Drawing Sheets

(58) Field of Classification Search
USPC .......................................... 257/40, 59, 71, 99
See application file for complete search history.

(56) References Cited

U.S. PATENT DOCUMENTS

| | | | |
|---|---|---|---|
| 2006/0205218 A1* | 9/2006 | Mueller | H01L 21/31053 |
| | | | 438/692 |
| 2006/0237725 A1* | 10/2006 | Jeong | H10D 30/60 |
| | | | 257/69 |
| 2011/0039378 A1* | 2/2011 | Voldman | H10D 30/603 |
| | | | 257/E21.334 |
| 2017/0133512 A1* | 5/2017 | Liu | H10D 30/6757 |
| 2017/0140938 A1* | 5/2017 | Niedernostheide | |
| | | | H01L 21/26513 |
| 2019/0088788 A1* | 3/2019 | Ban | H10D 30/6715 |
| 2019/0333944 A1* | 10/2019 | Xiao | H10D 86/60 |
| 2020/0105799 A1* | 4/2020 | Yuan | H10D 86/481 |
| 2020/0294752 A1* | 9/2020 | Sun | G06F 3/0421 |

FOREIGN PATENT DOCUMENTS

| | | | |
|---|---|---|---|
| CN | 110211974 A | 9/2019 | |
| CN | 110707098 A | 1/2020 | |
| CN | 111863837 A | 10/2020 | |
| CN | 112951850 A | 6/2021 | |
| CN | 113327949 A | 8/2021 | |

* cited by examiner

DISPLAY SUBSTRATE WITH STACKED ACTIVE DEVICES, METHOD FOR MANUFACTURING THE DISPLAY SUBSTRATE, AND DISPLAY APPARATUS COMPRISING THE DISPLAY SUBSTRATE

TECHNICAL FIELD

The present disclosure relates to the field of display technology, and in particular to a display substrate, a method for manufacturing a display substrate, and a display apparatus.

BACKGROUND

With the continuous development of display technology, the resolution of display products is continuously improved. Currently, a display substrate generally includes a plurality of pixel units arranged in an array, where each pixel unit includes a pixel driving circuit and a light emitting device, and the pixel driving circuit includes a plurality of transistors located in a same layer. An area occupied by each transistor on a plane parallel to a base substrate is difficult to be further reduced due to the limitation in a process for manufacturing a transistor, so that an area occupied by the pixel driving circuit on the plane parallel to the base substrate is difficult to be further reduced, and the resolution of a display apparatus is difficult to be further improved.

SUMMARY

The present disclosure is directed to at least one of the technical problems in the prior art, and provides a display substrate, a method for manufacturing a display substrate, and a display apparatus.

In a first aspect, the embodiment of the present disclosure provides a display substrate, including: a base substrate, a first transistor layer and a second transistor layer sequentially arranged along a direction away from the base substrate; the first transistor layer includes a first active layer; the second transistor layer includes a second active layer, and at least one insulating layer is arranged between the first active layer and the second active layer; the first active layer and the second active layer both are made of low-temperature polysilicon materials; the first active layer includes at least one first channel region and at least one first source-drain doped region; the second active layer includes at least one second channel region and at least one second source-drain doped region; an orthographic projection of the at least one second source-drain doped region on the base substrate overlaps with an orthographic projection of the at least one first source-drain doped region on the base substrate; and the at least one second source-drain doped region is connected to a corresponding first source-drain doped region through a corresponding connecting part filled in a corresponding first via in the at least one insulating layer.

In some embodiments, a material of each connecting part includes at least two types of silicon with different crystallinities and doping ions for conductorization.

In some embodiments, the at least two types of silicon with different crystallinities include: amorphous silicon and polysilicon.

In some embodiments, each connecting part has at least two doping concentration centers in a direction perpendicular to the base substrate.

In some embodiments, a slope angle of each first via is in a range of 30° to 75°.

In some embodiments, an orthographic projection of the at least one first channel region on the base substrate overlaps with an orthographic projection of the at least one second channel region on the base substrate.

In some embodiments, a shielding electrode pattern is disposed between the first active layer and the second active layer; and an orthographic projection of the shielding electrode pattern on the base substrate covers a region where the orthographic projections of the at least one first channel region and the at least one second channel region on the base substrate overlap with each other.

In some embodiments, the first transistor layer further includes: a first gate insulating layer on a side of the first active layer away from the base substrate; and a first conductive layer on a side of the first gate insulating layer away from the base substrate, and including gate electrodes of respective transistors located in the first transistor layer and corresponding to the at least one first channel region.

In some embodiments, the first conductive layer further includes: first terminal plates of capacitors; the first transistor layer further includes: a second gate insulating layer on a side of the first conductive layer away from the base substrate; and a second conductive layer on a side of the second gate insulating layer away from the base substrate and including a second terminal plate of each capacitor opposite to a first terminal plate of the capacitor In some embodiments, the shielding electrode pattern is between the first active layer and the second active layer and in the second conductive layer.

In some embodiments, the second transistor layer further includes: a second buffer layer on a side of the second active layer close to the base substrate and in contact with the second active layer.

In some embodiments, the second buffer layer has a thickness in a range of 1200 Å to 10000 Å.

In some embodiments, the second transistor layer further includes: a third gate insulating layer on a side of the second active layer away from the base substrate; and a third conductive layer on a side of the third insulating layer away from the base substrate, and including gate electrodes of respective transistors in the second transistor layer and corresponding to the at least one second channel region.

In some embodiments, the display substrate further includes: an interlayer dielectric layer on a side of the second transistor layer away from the base substrate; and a fourth conductive layer on a side of the interlayer dielectric layer away from the base substrate; wherein the fourth conductive layer includes: data lines and conductive connection structures, wherein each conductive connection structure is connected to a corresponding first source-drain doped region or a corresponding second source-drain doped region through a corresponding via.

In some embodiments, the display substrate further includes: a planarization layer on a side of the fourth conductive layer away from the base substrate; a first electrode layer on a side of the planarization layer away from the base substrate and including a plurality of first electrodes, each of which is connected to a corresponding conductive connection structure through a corresponding via to be electrically connected to a corresponding first source-drain doped region or a corresponding second source-drain doped region; a first pixel defining layer on a side of the first electrode layer away from the base substrate, wherein a plurality of first pixel accommodating holes are formed in the first pixel defining layer, and each first electrode is exposed through a corresponding first pixel accommodating hole; a light emitting layer including a plurality of electroluminescent patterns in the corresponding first pixel accommodating holes; and a second electrode layer on a side of the first pixel defining layer away from the base substrate.

In some embodiments, a material of the plurality of electroluminescent patterns includes organic light emitting materials or quantum dot materials.

In some embodiments, the display substrate further includes: an encapsulation layer on a side of the second electrode layer away from the base substrate; and a color resist layer on a side of the encapsulation layer away from the base substrate, and including a plurality of color resist patterns in a one-to-one correspondence with the plurality of electroluminescent patterns.

In some embodiments, a material of the plurality of electroluminescent patterns includes an organic light emitting material, the display substrate further includes: a light conversion layer between the encapsulation layer and the color resist layer and including a plurality of light conversion color filters which in a one-to-one correspondence with at least some of the plurality of electroluminescent patterns; and wherein a material of the plurality of light conversion color filters includes a quantum dot material.

In some embodiments, the display substrate includes a plurality of pixel units on the base substrate, each of which includes a light emitting element and a pixel driving circuit for driving the light emitting element; and each pixel driving circuit includes: a driving transistor configured to output a driving current to a corresponding light emitting element according to a gate-source voltage of the driving transistor.

In some embodiments, the driving transistor is in the first transistor layer, and a channel region and a source-drain doped region of the driving transistor are in the first active layer.

In some embodiments, each pixel driving circuit further includes: a data writing transistor, a threshold compensation transistor, a first reset transistor, a second reset transistor, a first light emitting control transistor, a second light emitting control transistor and a capacitor; a gate electrode of the data writing transistor is electrically connected to a corresponding gate line, a first electrode of the data writing transistor is electrically connected to a corresponding data line, and a second electrode of the data writing transistor is electrically connected to a first electrode of the driving transistor; a gate electrode of the threshold compensation transistor is electrically connected to a corresponding gate line, a first electrode of the threshold compensation transistor is electrically connected to a second electrode of the driving transistor, and a second electrode of the threshold compensation transistor is electrically connected to a gate electrode of the driving transistor; a gate electrode of the first reset transistor is electrically connected to a corresponding reset control signal line, a first electrode of the first reset transistor is electrically connected to a reset voltage transmission line, and a second electrode of the first reset transistor is electrically connected to the gate electrode of the driving transistor; a gate electrode of the second reset transistor is electrically connected to a corresponding reset control signal line or a corresponding gate line, a first electrode of the second reset transistor is electrically connected to the reset voltage transmission line, and a second electrode of the second reset transistor is electrically connected to a first electrode of the light emitting element; a gate electrode of the first light emitting control transistor is electrically connected to a light emitting control signal line, a first electrode of the first light emitting control transistor is electrically connected to an operating voltage transmission line, and a second electrode of the first light emitting control transistor is electrically connected to the first electrode of the driving transistor; a gate electrode of the second light emitting control transistor is electrically connected to the light emitting control signal line, a first electrode of the second light emitting control transistor is connected to the second electrode of the driving transistor, and a second electrode of the second light emitting control transistor is electrically connected to the first electrode of the light emitting element; and a first terminal plate of the capacitor is connected to the gate electrode of the driving transistor, and a second terminal plate of the capacitor is connected to the operating voltage transmission line.

In some embodiments, the data writing transistor is in the first transistor layer, and a channel region and a source-drain doped region of the data writing transistor are in the first active layer; the threshold compensation transistor is in the first transistor layer, and a channel region and a source-drain doped region of the threshold compensation transistor are in the first active layer; the first reset transistor is in the first transistor layer, and a channel region and a source-drain doped region of the first reset transistor are in the first active layer; the second reset transistor is in the second transistor layer, and a channel region and a source-drain doped region of the second reset transistor are in the second active layer; the first light emitting control transistor is in the second transistor layer, and a channel region and a source-drain doped region of the first light emitting control transistor are in the second active layer; and the second light emitting control transistor is in the second transistor layer, and a channel region and a source-drain doped region of the second light emitting control transistor are in the second active layer.

In a second aspect, an embodiment of the present disclosure further provides a display apparatus, including: the display substrate of the above first aspect.

In a third aspect, an embodiment of the present disclosure further provides a method for manufacturing a display substrate, wherein the display substrate is the display substrate of the above first aspect, and the method includes: forming a first transistor layer on a side of a base substrate; wherein the first transistor layer includes a first active layer, a material of the first active layer includes a low-temperature polysilicon material, and the first active layer includes at least one first channel region and at least one first source-drain doped region; and forming a second transistor layer on a side of the first transistor layer away from the base substrate; wherein the second transistor layer includes a second active layer, and at least one insulating layer is arranged between the first active layer and the second active layer; the second active layer is made of low-temperature polysilicon materials; the second active layer includes at least one second channel region and at least one second source-drain doped region; an orthographic projection of the at least one second source-drain doped region on the base substrate overlaps with an orthographic projection of the at least one first source-drain doped region on the base substrate; and the at least one second source-drain doped region is connected to a corresponding first source-drain doped region through a corresponding connecting part filled in a corresponding first via in the at least one insulating layer.

In some embodiments, the forming a first transistor layer includes: forming a first polysilicon material film on a side of the base substrate, and patterning the first polysilicon material film, to obtain a first polysilicon pattern; forming a first gate insulating layer on a side of the first polysilicon pattern away from the base substrate; forming a first conductive layer on a side of the first gate insulating layer away from the base substrate; wherein the first conductive layer includes gate electrodes of respective transistors in the first transistor layer; and performing an ion implantation on the first polysilicon pattern by using the first conductive layer as a mask for doping; wherein a portion of the first polysilicon pattern not covered by the first conductive layer is conductorized as the at least one first source-drain doped region, and a portion of the first polysilicon pattern covered by the first conductive layer is used as the at least one first channel region.

In some embodiments, the forming a second transistor layer includes: forming a second polysilicon material film on a side of the first transistor layer away from the base substrate, and patterning the second polysilicon material film to obtain second polysilicon patterns, each of which is filled in a corresponding first via; forming a third gate insulating layer on a side of the second polysilicon patterns away from the base substrate; forming a third conductive layer on a side of the third gate away from the base substrate; wherein the third conductive layer includes gate electrodes of respective transistors in the second transistor layer; and performing an ion implantation on the second polysilicon patterns by using the third conductive layer as a mask for doping; wherein portions of the second polysilicon patterns not covered by the third conductive layer are conductorized as the at least one second source-drain doped region and the connecting parts, and portions of the second polysilicon patterns covered by the third conductive layer are used as the at least one second channel region.

In some embodiments, the forming a second transistor layer includes: forming a second polysilicon material film on a side of the first transistor layer away from the base substrate, and patterning the second polysilicon material film to obtain second polysilicon patterns, each of which is filled in a corresponding first via; forming a patterned photoresist layer on a side of the second polysilicon patterns away from the base substrate; wherein the patterned photoresist layer covers a region where the at least one second channel region is to be formed subsequently and exposes a region where the at least one second source-drain doped region and connecting parts are to be formed subsequently; and performing an ion implantation on the second polysilicon patterns by using the patterned photoresist layer as a mask for doping; wherein portions of the second polysilicon patterns not covered by the patterned photoresist layer are conductorized as the at least one second source-drain doped region and connecting parts, and portions of the second polysilicon patterns covered by the patterned photoresist layer are used as the at least one second channel region.

In some embodiments, the performing an ion implantation on the second polysilicon patterns includes: performing the ion implantation several times, so that each of the connecting parts formed by conductorizing portions of the second polysilicon patterns filled in the first vias has at least two doping concentration centers in the direction perpendicular to the base substrate.

In some embodiments, an ion beam energy for the ion implantation is in a range of 5 KeV to 90 KeV; and an ion beam dosage for the ion implantation is in a range of $10^{17}/cm^2$ to $10^{22}/cm^2$.

In some embodiments, before the forming a second polysilicon material film on a side of the first transistor layer away from the base substrate, the method further includes: forming a second buffer layer on a side of the first transistor layer away from the base substrate, wherein a thickness of the second buffer layer is in a range of 1200 Å to 10000 Å.

DETAIL DESCRIPTION OF EMBODIMENTS

In order to enable one of ordinary skill in the art to better understand the technical solutions of the present disclosure, a display substrate, a method for manufacturing a display substrate, and a display apparatus of the present disclosure will be described in further detail with reference to the accompanying drawings.

In a Low Temperature Polysilicon (LTPS) Thin Film Transistor (TFT) type display substrate in the related art, all LTPS-TFTs are arranged in a direction parallel to a base substrate. That is, all the LTPS-TFTs are located in the same transistor layer. Specifically, active layers of all the LTPS-TFTs are arranged in the same layer. Due to the limitation from a process for manufacturing a LTPS-TFT, an area occupied by each pixel driving circuit on a plane parallel to the base substrate is difficult to be further reduced, and the resolution of a display apparatus is difficult to be further improved.

In order to effectively solve the technical problems in the related art, the present disclosure provides a corresponding solution.

Figure 1:
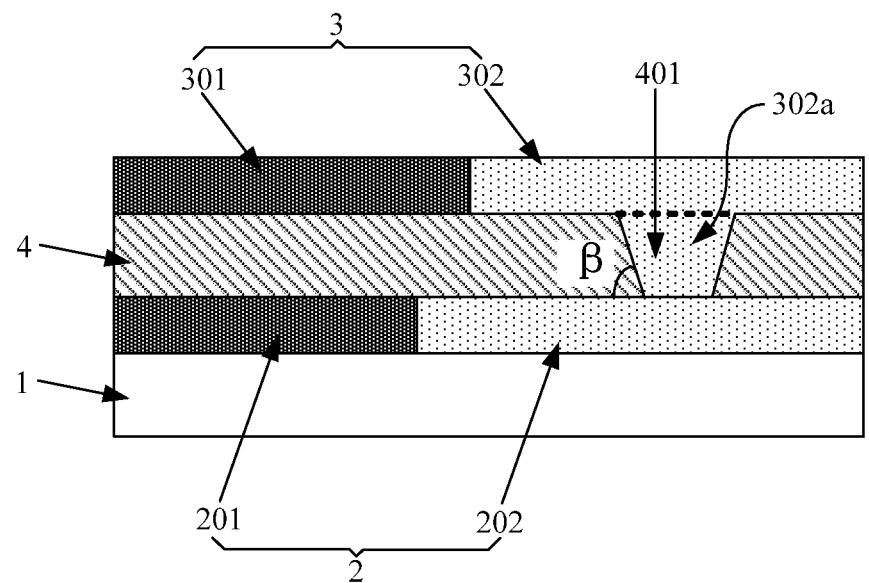
FIG. 1 is a schematic cross-sectional view of a portion of a display substrate according to an embodiment of the present disclosure.

FIG. 1 is a schematic cross-sectional view of a portion of a display substrate according to an embodiment of the present disclosure. As shown in FIG. 1, the display substrate includes: a base substrate 1, a first transistor layer and a second transistor layer sequentially arranged along a direction away from the base substrate 1. The first transistor layer includes a first active layer 2, the second transistor layer includes a second active layer 3, and at least one insulating layer is arranged between the first active layer 2 and the second active layer 3.

The first active layer 2 and the second active layer 3 both are made of low-temperature polysilicon materials; the first active layer 2 includes at least one first channel region 201 and at least one first source-drain doped region 202; the second active layer 3 includes at least one second channel region 301 and at least one second source-drain doped region 302; an orthographic projection of the at least one second source-drain doped region 302 on the base substrate 1 overlaps with an orthographic projection of the at least one first source-drain doped region 202 on the base substrate 1; and the at least one second source-drain doped region 302 is connected to a corresponding first source-drain doped region 202 through a corresponding connecting part 302a filled in a corresponding first via 401 in the at least one insulating layer 4.

It should be noted that a "transistor layer" in the embodiment of the present disclosure refers to a layer in which a transistor is formed; a "channel region" is a portion with semiconductor characteristics of an active layer and as an active channel of a transistor; a "source-drain doped region" in the embodiment of the present disclosure is a portion of an active layer which is conductorized by doping, and can be used as a source electrode and a drain electrode of a transistor. The channel region and the source-drain doped region of each active layer may be an integrally formed low-temperature polysilicon layer.

In the embodiment of the present disclosure, the two transistor layers are stacked and the active layers in the two transistor layers overlap with each other. That is, transistors in each pixel driving circuit may be distributed in the two transistor layers as required, and the source-drain doped regions of at least two transistors in each pixel driving circuit overlap with each other in a direction perpendicular to the base substrate. With this design, an area occupied by each pixel driving circuit on the plane parallel to the base substrate is reduced.

Meanwhile, source and drain electrodes respectively from two transistors are inevitably required to be electrically connected to each other in each pixel driving circuit (which will be described below in detail in a combination with specific examples). In the embodiment of the present disclosure, two transistors with the source and drain electrodes required to be electrically connected each other may be arranged in the first transistor layer and the second transistor layer respectively as needed, and a source-drain doped region (i.e., a second source-drain doped region 302) of one transistor located in the second transistor layer is connected to a source-drain doped region (i.e., a first source-drain doped region 202) of one transistor located in the first transistor layer through the first via 401 in the insulating layer 4, so as to achieve electrical connection between the source and drain electrodes respectively from the two transistors. In some embodiments, a material of the connecting part includes at least two types of silicon with different crystallinities and doping ions for conductorization. That is, the connecting part and the at least one second source-drain doped region may be simultaneously formed based on a doping process for the same silicon material film, and the connecting part may be regarded as a part of the second source-drain doped region. In the embodiment of the present disclosure, the source-drain doped regions of the two transistors located in different transistor layers are connected to each other through the via, so that it is not necessary to additionally arrange other conductive structures for electrically connecting the source-drain doped regions of the two transistors, and thus, the wiring space can be saved to a certain extent, and the area occupied by each pixel driving circuit on the plane parallel to the base substrate can be advantageously reduced.

In the embodiment of the present disclosure, a process for forming the second active layer 3 is as follows: firstly, forming an amorphous silicon (α-Si) material film, wherein the amorphous silicon material film is filled in each first via 401; then, laser irradiation is performed on the amorphous silicon material film by adopting an excimer laser annealing (ELA) technology, to form a polysilicon material film; then, a patterning process (also called a composition process, and generally including photoresist coating, exposure, development, film etching, photoresist stripping and other processes) is performed on the polysilicon material film, to obtain a polysilicon pattern filled in each first via 401; and then, an ion implantation process is performed on a portion of the polysilicon pattern as needed, so as to conductorize a corresponding region, to obtain the second active layer. At this time, the conductorized portion of the polysilicon pattern is used as source-drain doped regions and the connecting part, and an un-conductorized portion of the polysilicon pattern which maintains semiconductor characteristics is used as channel regions.

Generally, in the process of crystallizing the amorphous silicon with a greater thickness in the via to form the polysilicon, a complex crystallization process is often required to ensure that the amorphous silicon in the via is crystallized as much as possible (for example, the ELA process is performed several times and different focal depths are selected to increase the crystallization amount of the amorphous silicon), which results in a longer duration and a greater energy consumption for the crystallization process.

In the present application, during manufacturing the second active layer 3, in the process of crystallizing the amorphous silicon material film for forming the second active layer 3, the conventional ELA process is still used, and only a portion of the amorphous silicon material film located above the active layer needs to be completely crystallized as much as possible, while a portion of the amorphous silicon material film located in the first via may be in a mixture of the amorphous silicon and the polysilicon, which is caused by the following fact: it is necessary to perform the ion implantation process on a portion, which is located in the via, of the polysilicon pattern obtained through the crystallization process and the patterning process for the conductorization, so that both the amorphous silicon and the polysilicon are heavily doped through the ion implantation process, and therefore, can have good ohmic contact and have a low resistance value in the embodiment of the present disclosure. Therefore, in the embodiment of the present disclosure, a material of the connecting part 302a finally filled in the first via 401 includes: the amorphous silicon, the polysilicon, and the doping ions for conductorization. With this design, the duration for manufacturing the second active layer 3 can be effectively shortened, and the process energy consumption can be reduced.

In some embodiments, each connecting part 302a has at least two doping concentration centers in a direction perpendicular to the base substrate 1. In the embodiment of the present disclosure, the portion, which is located in each first via 401, of the polysilicon pattern for forming the second active layer 3 has a greater thickness, and a center range of an ion implantation concentration in a single ion implantation process (the ion implantation process is performed once) is limited, so that the single ion implantation process cannot ensure that the portion of the polysilicon pattern located in the first via 401 can exhibit better conductivity. Therefore, in the embodiment of the present disclosure, the ion implantation process is performed several times and different ion implantation depths are selected, which ensures that the portion of the polysilicon pattern located in the first via 401 can be effectively heavily doped at different depths, thereby ensuring the conductivity. At this time, the formed connecting part 302 has at least two doping concentration centers in the direction perpendicular to the base substrate 1. In practical application, the ion implantation depth can be adjusted by changing the ion beam energy of the ion implantation process. Generally, the higher the ion beam energy is, the deeper the ion implantation depth is, and the deeper the resulting dopant concentration centers are, without considering other factors.

In some embodiments, a slope angle $\beta$ of each first via 401 is in a range of 30° to 75°. A slope angle of a via refers to an included angle formed between a slope surface used for enclosing the via in a structure and a bottom surface of the structure. In the embodiment of the present disclosure, each first via 401 is a tapered via, and an aperture of the first via is gradually reduced in a direction close to the base substrate 1, which is beneficial to forming the polysilicon through the laser energy density irradiation in the ELA process. The greater the slope angle $\beta$ is, the steeper the slope surface of the via is. Under the condition that an aperture at the bottom of each first via 401 is constant, the greater the slope angle $\beta$ is, the smaller an aperture on the top of the first via 401 is, and the smaller the occupied area of the first via 401 on the plane parallel to the base substrate 1 is. However, when the slope angle $\beta$ is greater, it is difficult for the amorphous silicon material film formed subsequently for manufacturing the second active layer 3 to cover the slope surface of each first via 401, so that the second active layer 3 is prone to fracture. The slope angle $\beta$ of each first via 401 is set to in a range of 30° to 75° in the embodiment of the present disclosure, by comprehensively considering a size of the via and the risk of the fracture of the second active layer 3. For example, the slope angle is 30°, 45°, 60°, or 75°.

Figure 2:
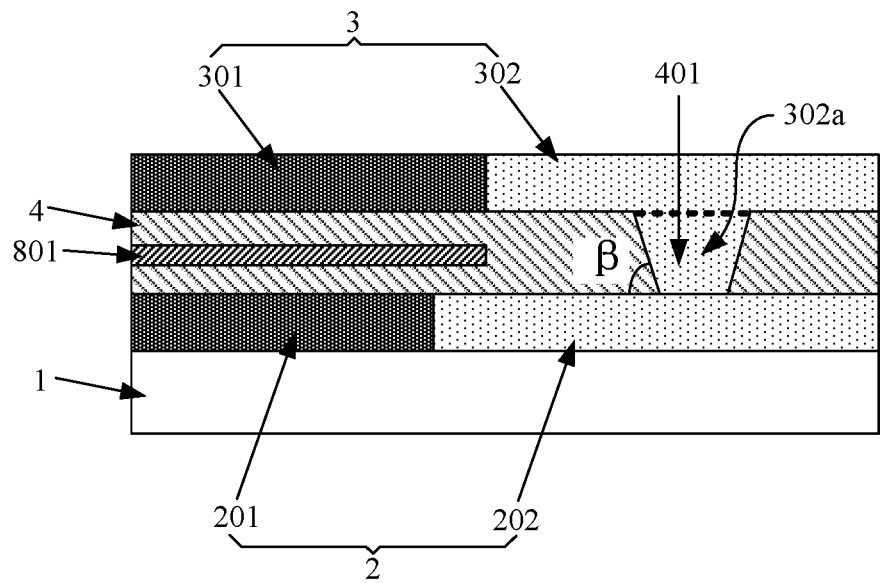
FIG. 2 is a schematic cross-sectional view of a portion of a display substrate according to an embodiment of the present disclosure.

FIG. 2 is a schematic cross-sectional view of a portion of a display substrate according to an embodiment of the present disclosure. As shown in FIG. 2, in some embodiments, an orthographic projection of the at least one first channel region 201 on the base substrate 1 overlaps with an orthographic projection of the at least one second channel region 301 on the base substrate 1. With this design, an overlapping area of the first active layer 2 and the second active layer 3 can be greater, which is more advantageous in reducing the area occupied by each pixel driving circuit on the plane parallel to the base substrate 1.

Further, a shielding electrode pattern 801 is disposed between the first active layer 2 and the second active layer 3; an orthographic projection of the shielding electrode pattern 801 on the base substrate 1 covers a region where orthographic projections of the at least one first channel region 201 and the at least one second channel region 301 on the base substrate 1 overlap with each other. In the embodiment of the present disclosure, the shielding electrode pattern 801 is disposed between two channel regions that overlap with each other in the direction perpendicular to the base substrate 1, which can effectively avoid a mutual interference between internal electric fields of transistors including the two channel regions.

Figure 3:
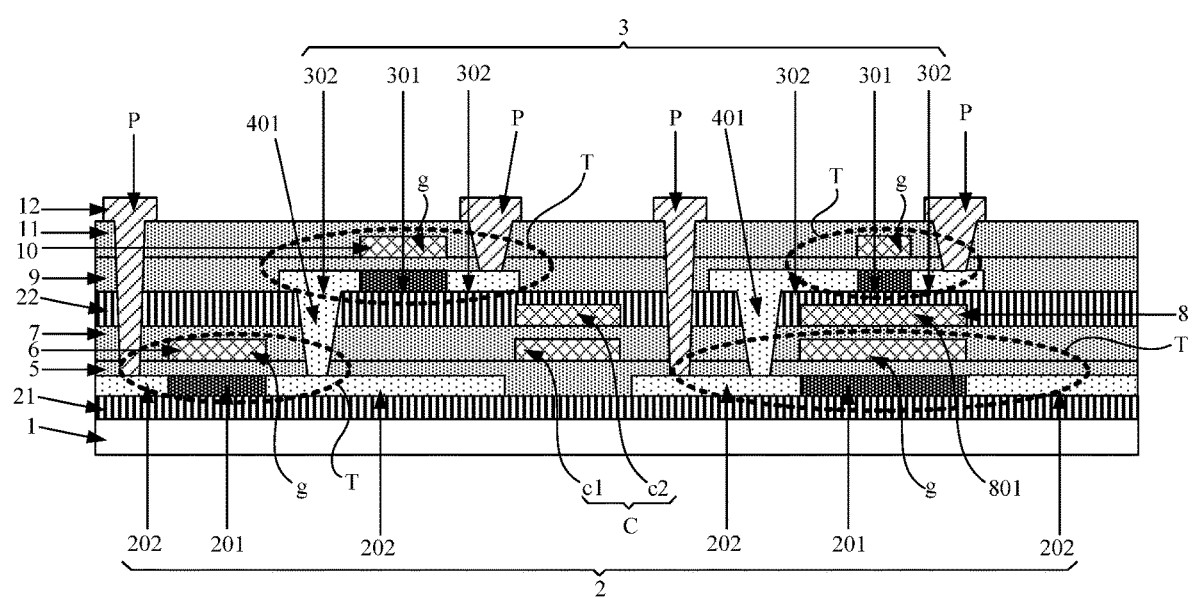
FIG. 3 is a schematic cross-sectional view of a portion of a display substrate according to an embodiment of the present disclosure.

FIG. 3 is a schematic cross-sectional view of a portion of a display substrate according to an embodiment of the present disclosure. As shown in FIG. 3, in some embodiments, the first transistor layer further includes: a first gate insulating layer 5 and a second conductive layer 8. The first gate insulating layer 5 is located on a side of the first active layer 2 away from the base substrate 1; the first conductive layer 6 is located on a side of the first gate insulating layer 5 away from the base substrate 1, and the first conductive layer 6 includes gate electrodes g of respective transistors T located in the first transistor layer and corresponding to the at least one first channel region 201.

In some embodiments, a first buffer layer 21 is further disposed between the first active layer 2 and the base substrate 1.

In some embodiments, the first conductive layer 6 further includes: first terminal plates c1 of capacitors C; the first transistor layer further includes: a second gate insulating layer 7 and a second conductive layer 8. The second gate insulating layer 7 is located on a side of the first conductive layer 6 away from the base substrate 1; the second conductive layer 8 is located on a side of the second gate insulating layer 7 away from the base substrate 1; and the second conductive layer 8 includes a second terminal plate c2 of each capacitor C disposed opposite to a first terminal plate c1 of the capacitor C.

In some embodiments, when the shielding electrode pattern 801 is disposed between the first active layer 2 and the second active layer 3, the shielding electrode pattern 801 is located in the second conductive layer 8.

In some embodiments, the second transistor layer further includes: a third gate insulating layer 9 and a third conductive layer 10. The third gate insulating layer 9 is located on a side of the second active layer 3 away from the base substrate 1; the third conductive layer 10 is located on a side of the third gate insulating layer 9 away from the base substrate 1; and the third conductive layer 10 includes gate electrodes g of respective transistors located in the second transistor layer and corresponding to the at least one second channel region 301.

In some embodiments, the second transistor layer further includes: a second buffer layer 22 located on a side of the second active layer 3 close to the base substrate 1 and in contact with the second active layer 3. The second buffer layer 22 is disposed, which can effectively improve the crystallization effect of the second active layer 3. Specifically, when no buffer layer is provided, a part of the amorphous silicon material film formed during manufacturing the second active layer 3 may cover a surface of the second conductive layer 8, and the remaining part may cover a surface of the second gate insulating layer 7 (when the second conductive layer 8 and the second gate insulating layer 7 are not present, a part of the amorphous silicon material film formed during manufacturing the second active layer 3 may cover a surface of the first conductive layer 6, and the remaining part may cover a surface of the first gate insulating layer 5). That is, a lower surface of the amorphous silicon material film contacts two different materials; in the process of crystallizing the amorphous silicon material film, the amorphous silicon in contact with the conductive layer and the amorphous silicon in contact with the gate insulating layer have a great crystallization difference therebetween, so that the resulting crystal structures have a great difference therebetween. In order to effectively solve the above problem, in the embodiment of the present disclosure, the second buffer layer 22 to be in contact with the second active layer 3 is formed before the second active layer 3 is formed, so as to ensure the crystallization uniformity of the amorphous silicon at respective positions during the crystallization.

In some embodiments, a thickness of the second buffer layer 22 is in a range of 1200 Å to 10000 Å. Further optionally, a thickness of the second buffer layer 22 is in a range of 2500 Å to 3000 Å.

In some embodiments, the display substrate further includes: an interlayer dielectric layer 11 and a fourth conductive layer 12. The interlayer dielectric layer 11 is located on a side of the second transistor layer away from the base substrate 1; the fourth conductive layer 12 is located on a side of the interlayer dielectric layer 11 away from the base substrate 1; and the fourth conductive layer 12 includes: data lines (not shown in FIG. 3) and conductive connection structures P, where each conductive connection structure P is connected to a corresponding first source-drain doped region 202 or a corresponding second source-drain doped region 302 through a corresponding via.

In the embodiment of the present disclosure, for the at least one first source-drain doped region 202 and the at least one second source-drain doped region 302, source and drain electrodes of transistors may be lead out through a corresponding conductive connection structure P according to the actual circuit requirement, so as to be electrically connected to other electrical structures. It should be noted that in the embodiment of the present disclosure, the source-drain doped regions of not all of transistors on the display substrate are provided with the corresponding conductive connection structures P, which are provided according to actual needs.

It should be noted that FIG. 3 only exemplarily shows 4 transistors T and 1 capacitor C, and 2 transistors T are located in the first transistor layer, and other 2 transistors T are located in the second transistor layer. In addition, FIG. 3 also only exemplarily shows 4 conductive connection structures P. The situation shown in FIG. 3 is merely exemplary, and does not limit the technical solution of the present disclosure.

Figure 4:
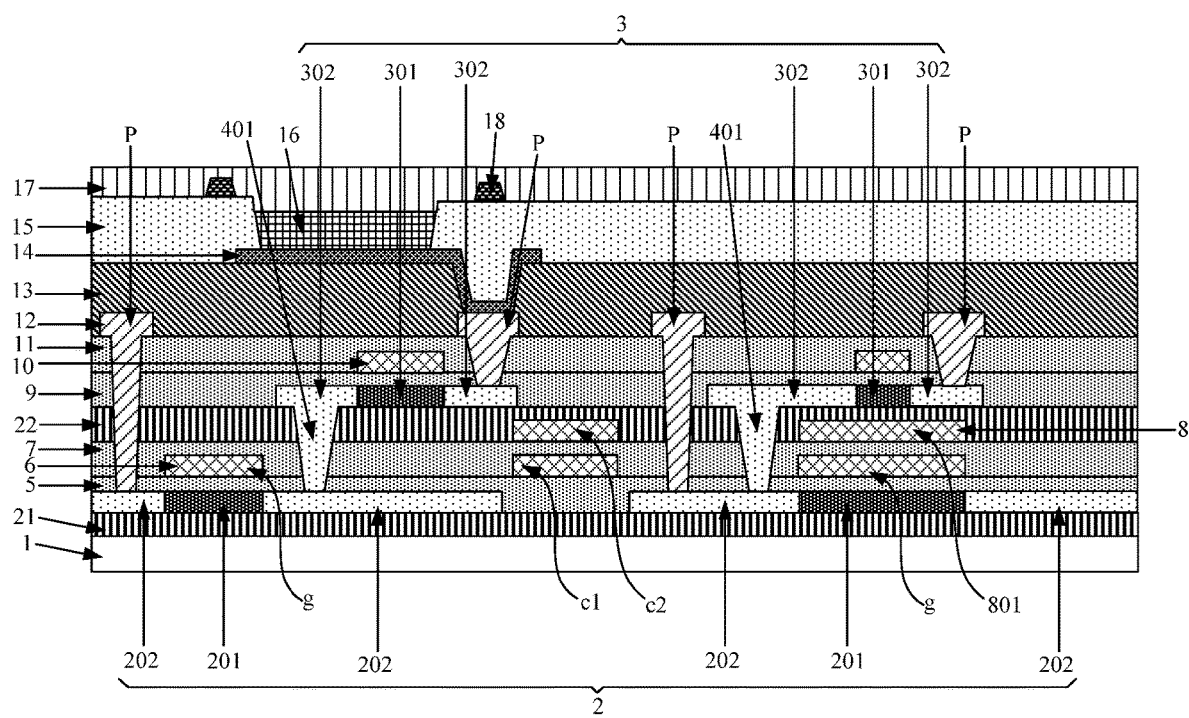
FIG. 4 is a schematic cross-sectional view of a portion of a display substrate according to an embodiment of the present disclosure.

FIG. 4 is a schematic cross-sectional view of a portion of a display substrate according to an embodiment of the present disclosure. As shown in FIG. 4, in some embodiments, the display substrate further includes: a planarization layer 13, a first pixel defining layer 15, a light emitting layer, and a second electrode layer 17.

The planarization layer 13 is located on a side of the fourth conductive layer 12 away from the base substrate 1; the first electrode layer is located on a side of the planarization layer 13 away from the base substrate 1, the first electrode layer includes a plurality of first electrodes, each of which is connected to a corresponding conductive connection structure P through a corresponding via to be electrically connected to a corresponding first source-drain doped region 202 or a corresponding second source-drain doped region 302; the first pixel defining layer 15 is located on a side of the first electrode layer away from the base substrate 1, a plurality of first pixel accommodating holes are formed in the first pixel defining layer 15, and each first electrode 14 is exposed through a corresponding first pixel accommodating hole; the light emitting layer includes a plurality of electroluminescent patterns 16 located in the corresponding first pixel accommodating holes; the second electrode layer is located on a side of the first pixel defining layer 15 away from the base substrate 1, and includes a second electrode 17. Optionally, the second electrode 17 is a planar electrode.

In the embodiment of the present disclosure, each first electrode 14, the electroluminescent pattern 16 in the first pixel accommodating hole corresponding to the first electrode 14, and the second electrode 17 constitute one light emitting element EL. Alternatively, some functional layers, such as an electron blocking layer, a hole transport layer, an electron transport layer, a hole blocking layer, etc., may be disposed between the first electrodes 14 and the electroluminescent patterns 16, and between the electroluminescent patterns 16 and the second electrode 17 according to actual requirements.

In some embodiments, a material of the electroluminescent patterns 16 is an organic light emitting material, and the light emitting element EL includes an organic light emitting diode (OLED).

In other embodiments, a material of the electroluminescent patterns 16 is a quantum dot material, and the light emitting element EL is a quantum dot light emitting diode (QLED).

Specifically, each electroluminescent pattern 16 may have a shape in which a plurality of quantum dots are dispersed in a matrix. The quantum dots may be semiconductor nanocrystals having various shapes, such as spherical, conical, multi-armed and/or cubic nanoparticles, nanotubes, nanowires, nanofibers, nanoplate particles, quantum rods, or quantum sheets. Here, the quantum rods may be quantum dots each having an aspect ratio (a length-width ratio) (a length:width ratio) of greater than about 1, such as greater than or equal to about 2, greater than or equal to about 3, or greater than or equal to about 5. For example, each quantum rod may have the aspect ratio of less than or equal to about 50, less than or equal to about 30, or less than or equal to about 20.

Each quantum dot may have, for example, a particle diameter for a spherical shape (or an average maximum particle length for a non-spherical shape) of about 1 nm to about 100 nm, about 1 nm to about 80 nm, about 1 nm to about 50 nm, or about 1 nm to 20 nm.

An energy band gap of the quantum dots can be controlled according to the size and the composition of the quantum dots, thereby controlling an emission wavelength. For example, quantum dots may have a narrow energy band gap and thus be configured to emit light in a wider wavelength range as the size of the quantum dots increases, while quantum dots may have a wide energy band gap and thus be configured to emit light in a narrower wavelength range as the size of the quantum dots decreases. For example, quantum dots may be configured to emit light in a predetermined wavelength range of the visible range, depending on the size and/or the composition of the quantum dots. For example, the quantum dots may be configured to emit blue light, red light, or green light. The blue light may have a peak emission wavelength ($\lambda_{max}$) in a range of about 430 nm to about 480 nm, for example. The red light may have a peak emission wavelength ($\lambda_{max}$) in a range of about 600 nm to about 650 nm, for example. The green light may have a peak emission wavelength ($\lambda_{max}$) in a range of about 520 nm to about 560 nm, for example.

For example, an average particle size of the quantum dots configured to emit blue light may be, for example, less than or equal to about 4.5 nm, and for example, less than or equal to about 4.3 nm, less than or equal to about 4.2 nm, less than or equal to about 4.1 nm, or less than or equal to about 4.0 nm. In this range, for example, the average particle size of the quantum dots may be in a range of about 2.0 nm to about 4.5 nm, such as about 2.0 nm to about 4.3 nm, about 2.0 nm to about 4.2 nm, about 2.0 nm to about 4.1 nm, or about 2.0 nm to about 4.0 nm.

The quantum dots may have a quantum yield of, for example, greater than or equal to about 10%, greater than or equal to about 20%, greater than or equal to about 30%, greater than or equal to about 50%, greater than or equal to about 60%, greater than or equal to about 70%, or greater than or equal to about 90%.

The quantum dots may have a narrower full width at half maximum (FWHM). Here, the FWHM is a width of a wavelength corresponding to half of a peak absorption point. When the FWHM is narrow, the quantum dots may be configured to emit light in a narrow wavelength range, and high color purity may be obtained. The quantum dots may have a FWHM of, for example, less than or equal to about 50 nm, less than or equal to about 49 nm, less than or equal to about 48 nm, less than or equal to about 47 nm, less than or equal to about 46 nm, less than or equal to about 45 nm, less than or equal to about 44 nm, less than or equal to about 43 nm, less than or equal to about 42 nm, less than or equal to about 41 nm, less than or equal to about 40 nm, less than or equal to about 39 nm, less than or equal to about 38 nm, less than or equal to about 37 nm, less than or equal to about 36 nm, less than or equal to about 35 nm, less than or equal to about 34 nm, less than or equal to about 33 nm, less than or equal to about 32 nm, less than or equal to about 31 nm, less than or equal to about 30 nm, less than or equal to about 29 nm, or less than or equal to about 28 nm. In this range, the quantum dots may have a FWHM in a range of, for example, about 2 nm to about 49 nm, about 2 nm to about 48 nm, about 2 nm to about 47 nm, about 2 nm to about 46 nm, about 2 nm to about 45 nm, about 2 nm to about 44 nm, about 2 nm to about 43 nm, about 2 nm to about 42 nm, about 2 nm to about 41 nm, about 2 nm to about 40 nm, about 2 nm to about 39 nm, about 2 nm to about 38 nm, about 2 nm to about 37 nm, about 2 nm to about 36 nm, about 2 nm to about 35 nm, about 2 nm to about 34 nm, about 2 nm to about 33 nm, about 2 nm to about 32 nm, about 2 nm to about 31 nm, about 2 nm to about 30 nm, about 2 nm to about 29 nm, or about 2 nm to about 28 nm.

For example, the quantum dots may include group II-VI semiconductor compounds, group III-V semiconductor compounds, group IV-VI semiconductor compounds, group IV semiconductor compounds, group I-III-VI semiconductor compounds, group I-II-IV-VI semiconductor compounds, group II-III-V semiconductor compounds, or combinations thereof. The group II-VI semiconductor compound may, for example, be selected from: binary compounds such as CdSe, CdTe, ZnS, ZnSe, ZnTe, ZnO, HgS, HgSe, HgTe, MgSe, MgS, or a mixture thereof; ternary compounds such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnSe, HgZnTe, MgZnSe, MgZnS, or a mixture thereof; and quaternary compounds such as HgZnTeS, CdZnSeS, CdZnSeTe, CdZnSTe, CdHgSeS, CdHgSeTe, CdHgSTe, HgZnSeS, HgZnSeTe, HgZnSTe, or a mixture thereof, which is not limited thereto. The group III-V semiconductor compounds may for example be selected from: binary compounds such as GaN, GaP, GaAs, GaSb, AlN, AlP, AlAs, AlSb, InN, InP, InAs, InSb, or a mixture thereof; ternary compounds such as GaNP, GaNAs, GaNSb, GaPAs, GaPSb, AlNP, AlNAs, AlNSb, AlPAs, AlPSb, InNP, InNAs, InNSb, InPAs, InPSb, or a mixture thereof; and quaternary compounds such as GaAlNP, GaAl-NAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a mixture thereof, which is not limited thereto. The group IV-VI semiconductor compounds may for example be selected from: binary compounds such as SnS, SnSe, SnTe, PbS, PbSe, PbTe, or a mixture thereof; ternary compounds such as SnSeS, SnSeTe, SnSTe, PbSeS, PbSeTe, PbSTe, SnPbS, SnPbSe, SnPbTe, or a mixture thereof; and quaternary compounds such as SnPbSSe, SnPbSeTe, SnPbSTe, or a mixture thereof, which is not limited thereto. The group IV semiconductor compounds may for example be selected from: elementary substance (mono) semiconductor compounds such as Si, Ge, or a mixture thereof; and binary semiconductor compounds such as SiC, SiGe, and a mixture thereof, which is not limited thereto. The group I-III-VI semiconductor compounds may be, for example, CuInSe2, CuInS2, CuInGaSe, CuInGaS, or a mixture thereof, which is not limited thereto. The group I-II-IV-VI semiconductor compounds may be, for example, CuZnSnSe, CuZnSnS, or a mixture thereof, which is not limited thereto. The group II-III-V semiconductor compounds may include, for example, InZnP, which is not limited thereto.

The quantum dots may include elementary substance semiconductor compounds, binary semiconductor compounds, ternary semiconductor compounds, or quaternary semiconductor compounds in a substantially uniform concentration or in a locally different concentration.

For example, the quantum dots may include cadmium-free (Cd-free) quantum dots. The cadmium-free quantum dots are quantum dots that do not include cadmium (Cd). Cadmium (Cd) may cause serious environmental/health problems and is a limited element according to the restriction of hazardous substances directive (RoHS) in many countries, and thus the cadmium-free quantum dots may be effectively used.

As an example, the quantum dots may be semiconductor compounds including zinc (Zn), and at least one of tellurium (Te) and selenium (Se). For example, the quantum dots may be Zn—Te semiconductor compounds, Zn—Se semiconductor compounds, and/or Zn—Te—Se semiconductor compounds. For example, the amount of tellurium (Te) may be less than the amount of selenium (Se) in the Zn—Te—Se semiconductor compounds. The semiconductor compounds may have a peak emission wavelength ($\lambda_{max}$) in a wavelength range of less than or equal to about 480 nm, e.g., about 430 nm to about 480 nm, and may be configured to emit blue light.

For example, the quantum dots may be semiconductor compounds including indium (In) and at least one of zinc (Zn) and phosphorus (P). For example, the quantum dots may be In—P semiconductor compounds and/or In—Zn—P semiconductor compounds. For example, in the In—Zn—P semiconductor compounds, a molar ratio of zinc (Zn) to indium (In) may be greater than or equal to about 25. The semiconductor compounds may have a peak emission wavelength ($\lambda_{max}$) in a wavelength range of less than about 700 nm, for example, about 600 nm to about 650 nm, and may be configured to emit red light.

The quantum dots may have a core-shell structure, in which one quantum dot surrounds another quantum dot. For example, a core and a shell of each quantum dot may have an interface, and elements of at least one of the core or the shell in the interface may have a concentration gradient, wherein the concentration of the elements of the shell decreases towards the core. For example, a material of the shell of each quantum dot has a higher energy band gap than that of the core of the quantum dot, and thus the quantum dot may exhibit a quantum confinement effect.

The quantum dots may have one quantum dot core and a plurality of quantum dot shells surrounding the core. Here, the plurality of shells has at least two shells, wherein each shell may be of a single composition, alloy, and/or have a concentration gradient.

For example, a shell of the plurality of shells farther from the core may have a higher energy band gap than a shell closer to the core, and thus the quantum dots may exhibit the quantum confinement effect.

For example, each of the quantum dots having the core-shell structure may include: a core including a first semiconductor compound including zinc (Zn) and at least one of tellurium (Te) and selenium (Se); and a shell disposed on at least a portion of the core and having a composition different from that of the core and including a second semiconductor compound.

For example, the first semiconductor compound may be a Zn—Te—Se based semiconductor compound including zinc (Zn), tellurium (Te), and selenium (Se), e.g., a Zn—Se based semiconductor compound including a small amount of tellurium (Te), e.g., a semiconductor compound represented by $ZnTe_xSe_{1-x}$, wherein x is greater than about 0 and less than or equal to 0.05.

For example, in the first semiconductor compound based on Zn—Te—Se, a molar amount of zinc (Zn) may be higher than that of selenium (Se), which in turn may be higher than that of tellurium (Te). For example, a molar ratio of tellurium (Te) to selenium (Se) in the first semiconductor compound may be less than or equal to about 0.05, less than or equal to about 0.049, less than or equal to about 0.048, less than or equal to about 0.047, less than or equal to about 0.045, less than or equal to about 0.044, less than or equal to about 0.043, less than or equal to about 0.042, less than or equal to about 0.041, less than or equal to about 0.04, less than or equal to about 0.039, less than or equal to about 0.035, less than or equal to about 0.03, less than or equal to about 0.029, less than or equal to about 0.025, less than or equal to about 0.024, less than or equal to about 0.023, less than or equal to about 0.022, less than or equal to about 0.021, less than or equal to about 0.02, less than or equal to about 0.019, less than or equal to about 0.018, less than or equal to about 0.017, less than or equal to about 0.016, less than or equal to about 0.015, less than or equal to about 0.014, less than or equal to about 0.013, less than or equal to about 0.012, less than or equal to about 0.011, or less than or equal to about 0.01. For example, a molar ratio of tellurium (Te) to zinc (Zn) in the first semiconductor compound may be less than or equal to about 0.02, less than or equal to about 0.019, less than or equal to about 0.018, less than or equal to about 0.017, less than or equal to about 0.016, less than or equal to about 0.015, less than or equal to about 0.014, less than or equal to about 0.013, less than or equal to about 0.012, less than or equal to about 0.011, or less than or equal to about 0.010.

The second semiconductor compound may include, for example, a group II-VI semiconductor compound, a group III-V semiconductor compound, a group IV-VI semiconductor compound, a group IV semiconductor compound, a group I-III-VI semiconductor compound, a group I-II-IV-VI semiconductor compound, a group II-III-V semiconductor compound, or a combination thereof. Examples of the group II-VI semiconductor compound, the group III-V semiconductor compound, the group IV-VI semiconductor compound, the group IV semiconductor compound, the group I-III-VI semiconductor compound, the group I-II-IV-VI semiconductor compound, and the group II-III-V semiconductor compound are the same as those described above.

For example, the second semiconductor compound may include zinc (Zn), selenium (Se), and/or sulfur (S). For example, the shell may include ZnSeS, ZnSe, ZnS, or a combination thereof. For example, the shell may include at least one inner shell disposed adjacent to the core and an outermost shell disposed on an outermost side of the quantum dot. The at least one inner shell may include ZnSeS, ZnSe, or a combination thereof, and the outermost shell may include ZnS. For example, the shell may have a concentration gradient of one component. For example, an amount of sulfur (S) of each shell may increase in a direction from the inner shell closest to the core to the outermost shell.

For example, each of the quantum dots having the core-shell structure may include: a core including a third semiconductor compound including indium (In) and at least one of zinc (Zn) and phosphorus (P); and a shell disposed on at least a portion of the core and including a fourth semiconductor compound having a different composition than the core.

In the third semiconductor compound based on In—Zn—P, a molar ratio of zinc (Zn) to indium (In) may be greater than or equal to about 25. For example, in the third semiconductor compound based on In—Zn—P, the molar ratio of zinc (Zn) to indium (In) may be greater than or equal to about 28, greater than or equal to about 29, or greater than or equal to about 30. For example, in the third semiconductor compound based on In—Zn—P, the molar ratio of zinc (Zn) to indium (In) may be less than or equal to about 55, such as less than or equal to about 50, less than or equal to about 45, less than or equal to about 40, less than or equal to about 35, less than or equal to about 34, less than or equal to about 33, or less than or equal to about 32.

The fourth semiconductor compound may include, for example, a group II-VI semiconductor compound, a group III-V semiconductor compound, a group IV-VI semiconductor compound, a group IV semiconductor, a group I-III-VI semiconductor compound, a group I-II-IV-VI semiconductor compound, a group II-III-V semiconductor compound, or a combination thereof. Examples of the group II-VI semiconductor compound, the group III-V semiconductor compound, the group IV-VI semiconductor compound, the group IV semiconductor compound, the group I-III-VI semiconductor compound, the group I-II-IV-VI semiconductor compound, and the group II-III-V semiconductor compound are the same as described above.

For example, the fourth semiconductor compound may include zinc (Zn) and sulfur (S), and optionally selenium (Se). For example, the shell may include ZnSeS, ZnSe, ZnS, or a combination thereof. For example, the shell may include at least one inner shell disposed adjacent to the core and an outermost shell disposed on an outermost side of the quantum dot. At least one of the at least one inner shell and the outermost shell may include the fourth semiconductor compound ZnS, ZnSe, or ZnSeS.

The light emitting layer may have a thickness in a range of about 5 nm to about 200 nm, such as about 10 nm to about 150 nm, about 10 nm to about 100 nm, or about 10 nm to about 50 nm. The quantum dots QD contained in the light emitting layer EML may be laminated into one or more layers, for example: two layers. However, embodiments of the inventive concept are not limited thereto. The quantum dots QD may be laminated into one or more layers with the number of any of one to ten. Depending on a type (or a category) of quantum dots QD used and the desired emission wavelength of light, the quantum dots QD may be laminated into layers with any suitable number.

The quantum dots may have a deep HOMO level of, for example, greater than or equal to about 5.4 eV, within which is, for example, greater than or equal to about 5.5 eV, greater than or equal to about 5.6 eV, greater than or equal to about 5.7 eV, greater than or equal to about 5.8 eV, greater than or equal to about 5.9 eV, or greater than or equal to about 6.0 eV. Within this range, the quantum dots may have a HOMO level in a range of, for example, about 5.4 eV to about 7.0 eV, about 5.4 eV to about 6.8 eV, about 5.4 eV to about 6.7 eV, about 5.4 eV to about 6.5 eV, about 5.4 eV to about 6.3 eV, about 5.4 eV to about 6.2 eV, about 5.4 eV to about 6.1 eV, within which is, for example, about 5.5 eV to about 7.0 eV, about 5.5 eV to about 6.8 eV, about 5.5 eV to about 6.7 eV, about 5.5 eV to about 6.5 eV, about 5.5 eV to about 6.3 eV, about 5.5 eV to about 6.2 eV, about 5.5 eV to about 6.1 eV, about 5.5 eV to about 7.0 eV, about 5.6 eV to about 6.8 eV, about 5.6 eV to about 6.7 eV, about 5.6 eV to about 6.5 eV, about 5.6 eV to about 6.3 eV, about 5.6 eV to about 6.2 eV, about 5.6 eV to about 6.1 eV, within which is, for example, about 5.7 eV to about 7.0 eV, about 5.7 eV to about 6.8 eV, about 5.7 eV to about 6.7 eV, about 5.7 eV to about 6.5 eV, about 5.7 eV to about 6.3 eV, about 5.7 eV to about 6.2 eV, about 5.7 eV to about 6.1 eV, within which is, for example, about 5.8 eV to about 7.0 eV, about 5.8 eV to about 6.8 eV, about 5.8 eV to about 6.7 eV, about 5.8 eV to about 6.5 eV, about 5.8 eV to about 6.3 eV, about 5.8 eV to about 6.2 eV, about 5.8 eV to about 6.1 eV, within which is, for example, about 6.0 eV to about 7.0 eV, about 6.0 eV to about 6.8 eV, about 6.0 eV to about 6.7 eV, about 6.0 eV to about 6.5 eV, about 6.0 eV to about 6.3 eV, about 6.0 eV to about 6.2 eV.

The quantum dots may have a shallow LUMO energy level of, for example, less than or equal to about 3.7 eV, within which is, for example, less than or equal to about 3.6 eV, less than or equal to about 3.5 eV, less than or equal to about 3.4 eV, less than or equal to about 3.3 eV, less than or equal to about 3.2 eV, or less than or equal to about 3.0 eV. In this range, the LUMO level of the quantum dots may be in a range of about 2.5 eV to about 3.7 eV, about 2.5 eV to about 3.6 eV, about 2.5 eV to about 3.5 eV, about 2.5 eV to about 3.4 eV, about 2.5 eV to about 3.3 eV, about 2.5 eV to about 3.2 eV, about 2.5 eV to about 3.1 eV, about 2.5 eV to about 3.0 eV, about 2.8 eV to about 3.7 eV, about 2.8 eV to about 3.6 eV, about 2.8 eV to about 3.5 eV, about 2.8 eV to about 3.4 eV, about 2.8 eV to about 3.3 eV, about 2.8 eV to about 3.2 eV, about 3.0 eV to about 3.7 eV, about 3.0 eV to about 3.6 eV, about 3.0 eV to about 3.5 eV, or about 3.0 eV to about 3.4 eV.

The quantum dots may have an energy band gap in a range of about 1.7 eV to about 2.3 eV or in a range of about 2.4 eV to about 2.9 eV. In this range, for example, the quantum dots may have an energy band gap in a range of about 1.8 eV to about 2.2 eV or in a range of about 2.4 eV to about 2.8 eV. In this range, the quantum dots may have an energy band gap in a range of about 1.9 eV to about 2.1 eV, or about 2.4 eV to about 2.7 eV.

In some embodiments, each first electrode 14 may be an anode, and the second electrode 17 is a cathode. In other embodiments, each first electrode 14 may be a cathode, and the second electrode 17 is an anode.

The light emitting principle of the light emitting device is: in a circuit connected to the anode and the cathode, holes are injected by the anode into the light emitting functional layer 133, and electrons are injected by the cathode into the light emitting functional layer 133, and the formed electrons and holes form excitons in each light emitting pattern 133a, which are back to the ground state through a radiative transition, to emit photons.

In some embodiments, the anode may include a conductor having a high work function, such as a metal, a conductive metal oxide, or a combination thereof. The metal may be nickel, platinum, vanadium, chromium, copper, zinc, or gold, or alloys thereof; the conductive metal oxide may be zinc oxide, indium oxide, tin oxide, Indium Tin Oxide (ITO), Indium Zinc Oxide (IZO), or fluorine-doped tin oxide. Alternatively, the combination of the metal and the conductive metal oxide may be ZnO and Al, or SnO2 and Sb, ITO/Ag/ITO, which is not limited thereto.

The cathode may include a conductor, such as a metal, a conductive metal oxide, and/or a conductive polymer, having a lower work function than that of the anode. For example, the cathode may include a metal such as aluminum, magnesium, calcium, sodium, potassium, titanium, indium, yttrium, lithium, gadolinium, silver, tin, lead, cesium, barium, or the like, or alloys thereof; a multi-layer structure such as LiF/Al, Li2O/Al, Liq/Al, LiF/Ca, and BaF2/Ca. The conductive metal oxide may be zinc oxide, indium oxide, tin oxide, Indium Tin Oxide (ITO), Indium Zinc Oxide (IZO), or fluorine-doped tin oxide, which is not limited thereto.

The work function of the anode may be higher than the work function of the cathode. For example, the work function of the anode may be in a range of about 4.5 eV to about 5.0 eV and the work function of the cathode may be in a range of about 4.0 eV to about 4.7 eV. Within this range, the work function of the anode may be, for example, in a range of about 4.6 eV to about 4.9 eV or in a range of about 4.6 eV to about 4.8 eV, and the work function of the cathode may be, for example, in a range of about 4.0 eV to about 4.6 eV or in a range of about 4.3 eV to about 4.6 eV.

The first electrodes 14 and the second electrode 17 may be a transmissive electrode, a partially transmissive and partially reflective electrode, or a reflective electrode. The transmissive electrode or the partially transmissive and partially reflective electrode may include: a conductive oxide such as zinc oxide, indium oxide, tin oxide, Indium Tin Oxide (ITO), Indium Zinc Oxide (IZO), or fluorine-doped tin oxide, or a thin metal layer. The reflective electrode may include: a reflective metal, such as an opaque conductor such as aluminum (Al), silver (Ag), or gold (Au). The first electrodes 14 and the second electrode 17 may have a single-layer or multi-layer structure;

At least one of the first electrodes 14 or the second electrode 17 may be connected to an auxiliary electrode (not shown). A resistance of the second electrode 17 can be reduced if the second electrode 17 is connected to the auxiliary electrode.

In some embodiments, the display substrate 1 may be a top emission type light emitting substrate or a bottom emission type light emitting substrate.

In the case where the display substrate is a top emission type light emitting substrate, the second electrode 17 may be a transmissive electrode and the first electrodes 14 may be a reflective electrode. In the case where the display substrate is a bottom emission type light emitting substrate, the first electrodes 14 are a transmissive electrode and the second electrode 17 is a reflective electrode.

Alternatively, in some embodiments, in the case where the display substrate may also be a double-sided emission type light emitting substrate, both the first electrodes 14 and the second electrode 17 are a transmissive electrode.

In other embodiments, the light emitting device may be an "upright" light emitting device or an "inverted" light emitting device.

In the case where the light emitting device is a "upright" light emitting device, each first electrode 14 is an anode and the second electrode 17 is a cathode. In the case where the light emitting device is an "inverted" light emitting device, each first electrode 14 is a cathode and the second electrode 17 is an anode.

In the embodiment of the present disclosure, the light emitted by the light emitting elements EL may be the same or different, which is not limited by the present disclosure.

In some embodiments, a plurality of isolation dams 18 are provided between the first pixel defining layer 15 and the first electrode layer; each isolation dam 18 is disposed between any adjacent pixel openings, and is used to support a mask in a process of depositing light emitting patterns into the pixel openings and to avoid color mixing.

Figure 5:
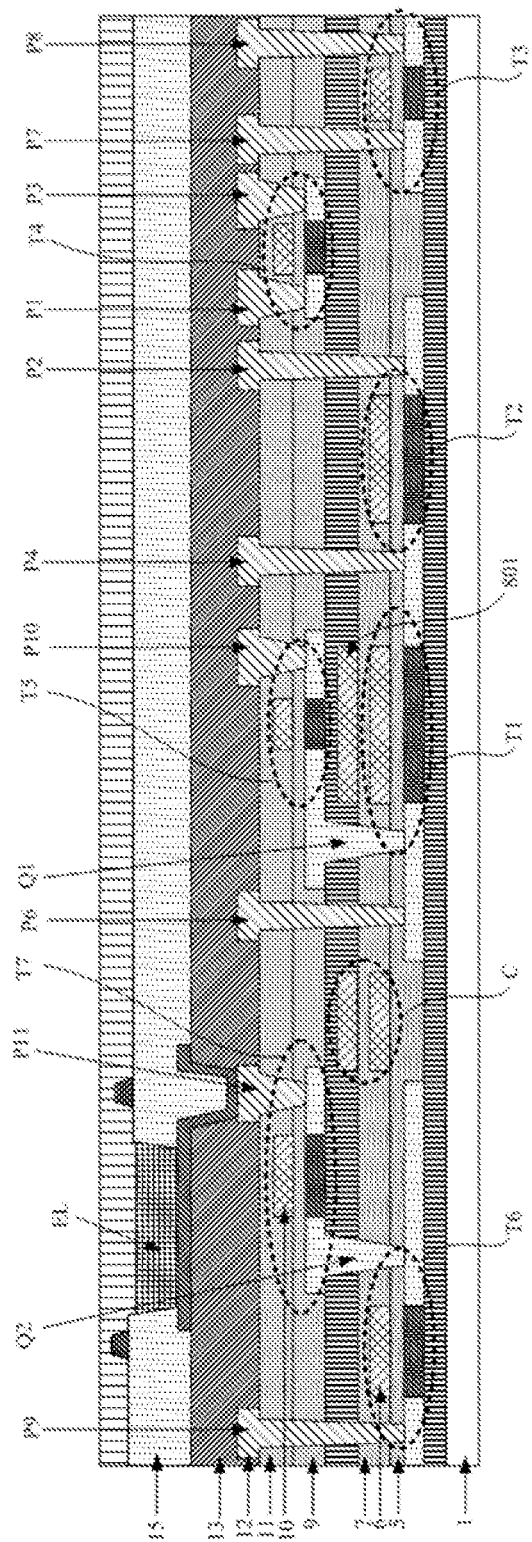
FIG. 5 is a schematic cross-sectional view of a portion of a display substrate according to an embodiment of the present disclosure.

FIG. 5 is another schematic cross-sectional view of a portion of a display substrate according to an embodiment of the present disclosure. As shown in FIG. 5, in some embodiments, the display substrate includes a plurality of pixel units on a base substrate 1, and each pixel unit includes a light emitting element EL and a pixel driving circuit for driving the light emitting element EL; each pixel driving circuit includes: a driving transistor T1 configured to output a driving current to a corresponding light emitting element EL according to its own gate-source voltage.

In some embodiments, each driving transistor T1 is located in the first transistor layer, and a channel region and a source-drain doped region of each driving transistor T1 are located in the first active layer 2. In the embodiment of the present disclosure, the electrical characteristics of each driving transistor T1 directly affect the accuracy of the driving current output by the pixel driving circuit, so the requirement for the quality of each driving transistor T1 is high. Considering that the stability of the process for manufacturing the first transistor layer is significantly higher than that of the second transistor layer in the actual process for manufacturing the display substrate, it is preferable to provide each driving transistor T1 in the first transistor layer in the embodiment of the present disclosure.

Figure 6:
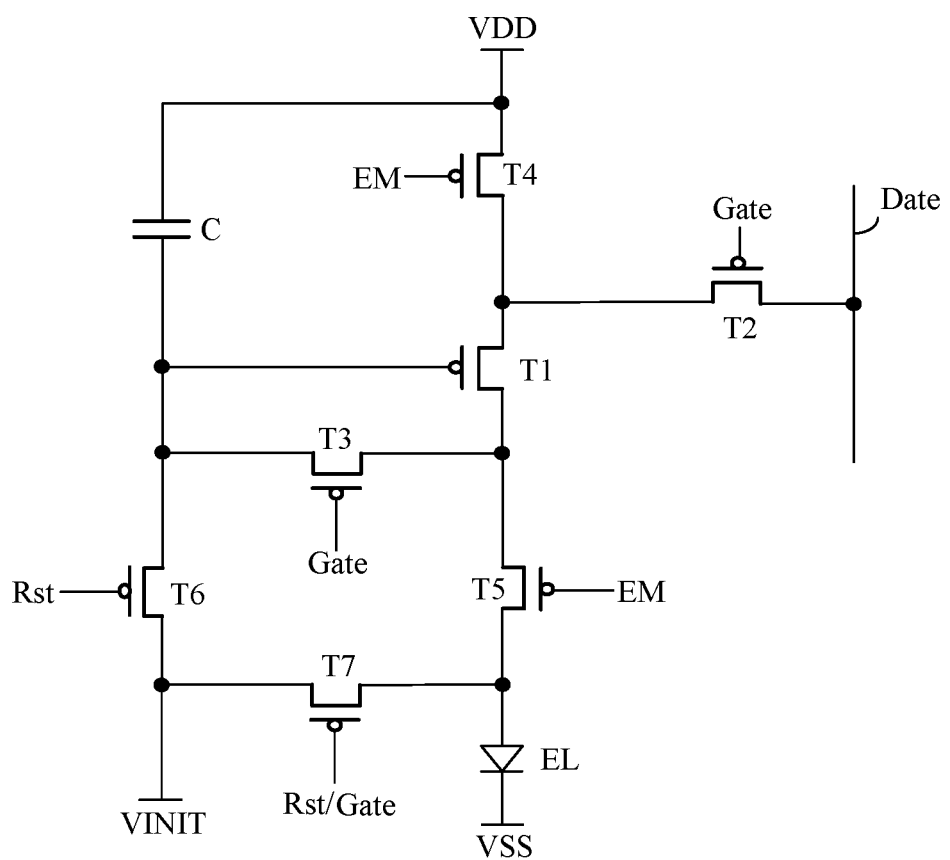
FIG. 6 is a schematic diagram of a circuit structure of a pixel driving circuit according to an embodiment of the present disclosure.
Figure 7:
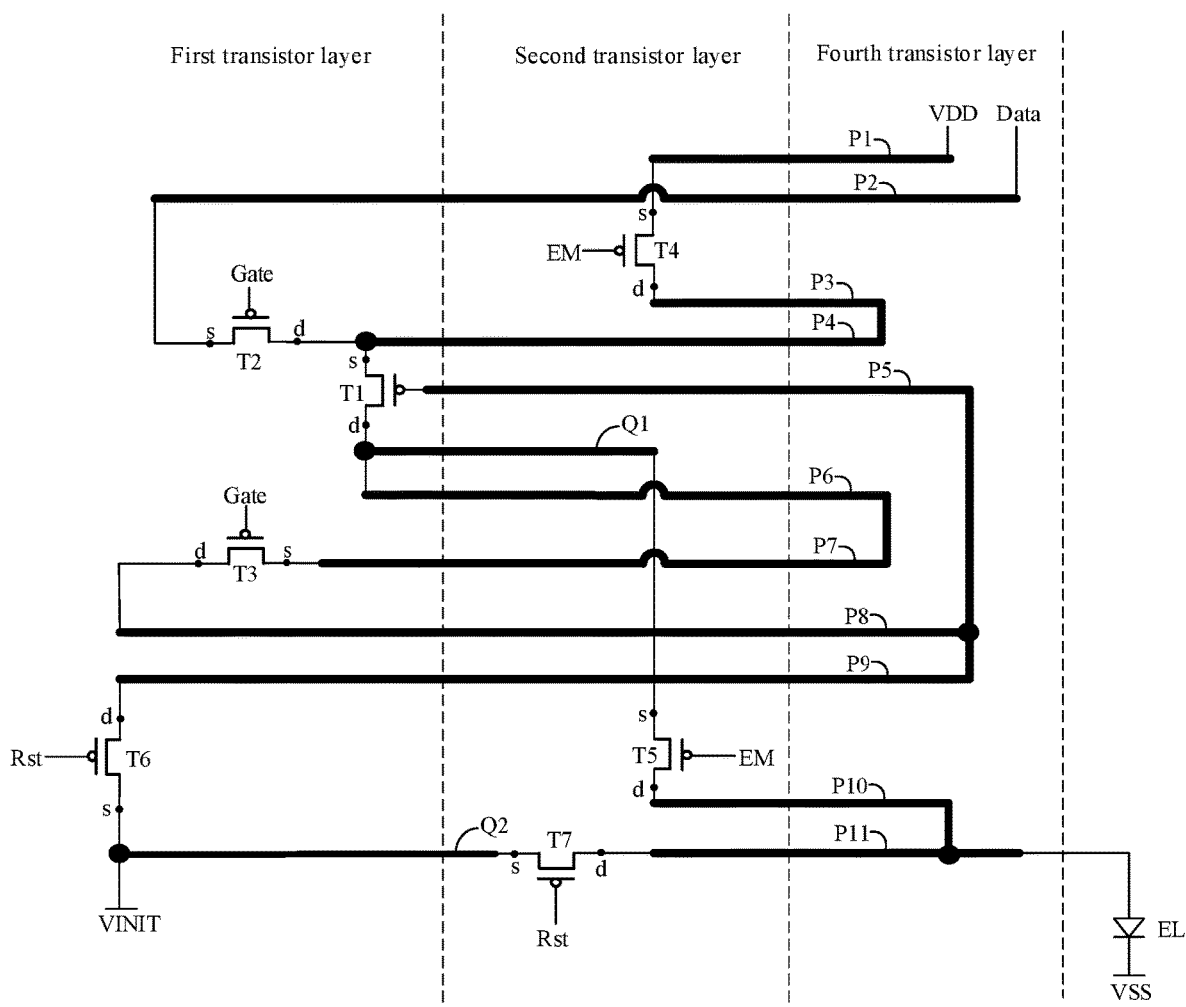
FIG. 7 is a schematic diagram illustrating a distribution of transistors in the pixel driving circuit shown in FIG. 6.

FIG. 6 is a schematic diagram of a circuit structure of a pixel driving circuit according to an embodiment of the present disclosure; FIG. 7 is a schematic diagram illustrating a distribution for transistors in the pixel driving circuit shown in FIG. 6. As shown in FIGS. 5 to 7, in some embodiments, each pixel driving circuit further includes: a data writing transistor T2, a threshold compensation transistor T3, a first reset transistor T6, a second reset transistor T7, a first light emitting control transistor T4, a second light emitting control transistor T5, and a capacitor C.

In the following description, one of a "first electrode" and a "second electrode" of a transistor is a source electrode of the transistor and the other is a drain electrode of the transistor. In general, a source electrode and a drain electrode of a transistor may be interchanged. In the following description, as an example, the first electrode s is used as a source electrode and the second electrode d is used as a drain electrode.

A gate electrode of the data writing transistor T2 is electrically connected to a corresponding gate line Gate, a first electrode s of the data writing transistor T2 is electrically connected to a corresponding data line Data, and a second electrode d of the data writing transistor T2 is electrically connected to a first electrode s of the driving transistor T1.

A gate electrode of the threshold compensation transistor T3 is electrically connected to a corresponding gate line Gate, a first electrode s of the threshold compensation transistor T3 is electrically connected to a second electrode d of the driving transistor T1, and a second electrode d of the threshold compensation transistor T3 is electrically connected to a gate electrode of the driving transistor T1.

A gate electrode of the first reset transistor T6 is electrically connected to a corresponding reset control signal line Rst, a first electrode s of the first reset transistor T6 is electrically connected to a reset voltage transmission line VINIT, and a second electrode d of the first reset transistor T6 is electrically connected to the gate electrode of the driving transistor T1.

A gate electrode of the second reset transistor T7 is electrically connected to a corresponding reset control signal line Rst or a corresponding gate line Gate, a first electrode s of the second reset transistor T7 is electrically connected to the reset voltage transmission line VINIT, and a second electrode d of the second reset transistor T7 is electrically connected to a first electrode 14 of the light emitting element EL.

A gate electrode of the first light emitting control transistor T4 is electrically connected to a light emitting control signal line EM, a first electrode s of the first light emitting control transistor T4 is electrically connected to an operating voltage transmission line VDD, and a second electrode d of the first light emitting control transistor T4 is electrically connected to the first electrode s of the driving transistor T1.

A gate electrode of the second light emitting control transistor T5 is electrically connected to the light emitting control signal line EM, a first electrode s of the second light emitting control transistor T5 is connected to the second electrode d of the driving transistor T1, and a second electrode d of the second light emitting control transistor T5 is electrically connected to the first electrode 14 of the light emitting element EL.

The first terminal plate c1 of the capacitor C is connected to the gate electrode of the driving transistor T1, and the second terminal plate c2 of the capacitor C is connected to the operating voltage transmission line VDD.

It should be noted that the pixel driving circuit shown in FIG. 6 employs 7T1C (i.e., the pixel driving circuit includes 7 transistors T1 to T7 and 1 capacitor C), which is only exemplary, and does not limit the technical solution of the present disclosure. The technical solution of the present disclosure is applicable to a pixel driving circuit with any structure.

Referring again to FIG. 5, in some embodiments, the data writing transistor T2 is located in the first transistor layer, and a channel region and a source-drain doped region of the data writing transistor T2 are located in the first active layer 2.

The threshold compensation transistor T3 is located in the first transistor layer, and a channel region and a source-drain doped region of the threshold compensation transistor T3 are located in the first active layer 2.

The first reset transistor T6 is located in the first transistor layer, and a channel region and a source-drain doped region of the first reset transistor T6 are located in the first active layer 2.

The second reset transistor T7 is located in the second transistor layer, and a channel region and a source-drain doped region of the second reset transistor T7 are located in the second active layer 3.

The first light emitting control transistor T4 is located in the second transistor layer, and a channel region and a source-drain doped region of the first light emitting control transistor T4 are located in the second active layer 3.

The second light emitting control transistor T5 is located in the second transistor layer, and a channel region and a source-drain doped region of the second light emitting control transistor T5 are located in the second active layer 3.

In the embodiment of the present disclosure, considering that the second electrode d of the second reset transistor T7 and the second electrode d of the second light emitting control transistor T5 are both electrically connected to the first electrode 14 of the light emitting element EL, the second reset transistor T7 and the second light emitting control transistor T5 are disposed in the second transistor layer closer to the first electrode 14, to reduce a distance between each of the second electrode d of the second reset transistor T7 and the second electrode d of the second light emitting control transistor T5 and the first electrode 14 of the light emitting element EL as much as possible, which is advantageous for the wiring design. Meanwhile, since the first and second light emitting control transistors T4 and T5 are controlled by a same light emitting control signal line EM, the first light emitting control transistor T4 is also disposed in the second transistor layer for convenience of wiring.

In addition, it is considered that the number of transistors disposed in the first transistor layer is closer to the number of transistors disposed in the second transistor layer, which advantageously increases an area of a region of the first active layer 2 and the second active layer 3 overlapping with each other, and advantageously decreases the area occupied by each pixel driving circuit in the plane parallel to the base substrate 1. Therefore, in the case where three transistors of the pixel driving circuit, that is, the first light emitting control transistor T4, the second light emitting control transistor T5, and the second reset transistor T7, are disposed in the second transistor layer, other three transistors of the pixel driving circuit, that is, the data writing transistor T2, the threshold compensation transistor T3, and the first reset transistor T6 are disposed in the first transistor layer. At this time, 4 transistors of the pixel driving circuit are arranged in the first transistor layer, and the other 3 transistors of the pixel driving circuit are arranged in the second transistor layer, so that the number of transistors disposed in the first transistor layer is closer to the number of transistors disposed in the second transistor layer.

Alternatively, in the embodiment of the present disclosure, according to actual needs, at least one of the data writing transistor T2, the threshold compensation transistor T3, and the first reset transistor T6 may also be disposed in the second transistor layer, and at least one of the second reset transistor T7, the first light emitting control transistor T4, and the second light emitting control transistor T5 may also be disposed in the first transistor layer. The above cases should fall within the scope of protection of the present disclosure. In the embodiment of the present disclosure, it only needs to ensure that the first transistor layer includes at least one transistor of the pixel driving circuit, and the second transistor layer includes at least one transistor of the pixel driving circuit, which is not described herein by way of example.

In the embodiment of the present disclosure, the gate line Gate, the light emitting control signal line EM, and the reset control signal line Rst may be selectively disposed in the first conductive layer 6 or the third conductive layer 10, respectively; the reset voltage transmission line VINIT may be disposed in the second conductive layer 8, and the operating voltage transmission line VDD may be disposed in the fourth conductive layer 12.

Referring to FIGS. 5 and 7, the first electrode s of the second light emitting control transistor T5 is connected to the second electrode d of the driving transistor T1 through a portion (i.e., a connecting part) Q1 located within a corresponding first via 401; and the first electrode s of the second reset transistor T7 is connected to the first electrode s of the first reset transistor T6 through a portion (i.e., a connecting part) Q2 located within a corresponding first via 401.

With continued reference to FIGS. 5 and 7, the following conductive connection structures P are provided in the fourth conductive layer 12:

A conductive connection structure provided for the driving transistor T1 includes: a conductive connection structure P5 (not shown in FIG. 5) connected to the gate electrode of the driving transistor T1 through a via; a conductive connection structure P4 connected to the first electrode s of the driving transistor T1 through a via; a conductive connection structure P6 connected to the second electrode d of the driving transistor T1 through a via.

A conductive connection structure provided for the data writing transistor T2 includes: a conductive connection structure P2 connected to the first electrode s of the data writing transistor T2 through a via.

A conductive connection structure provided for the threshold compensation transistor T3 includes: a conductive connection structure P7 connected to the first electrode s of the threshold compensation transistor T3 through a via; and a conductive connection structure P8 connected to the second electrode d of the threshold compensation transistor T3 through a via.

A conductive connection structure provided for the first light emitting control transistor T4 includes: a conductive connection structure P1 connected to the first electrode s of the first light emitting control transistor T4 through a via; a conductive connection structure P3 is connected to the second electrode d of the first light emitting control transistor T4 through a via.

A conductive connection structure provided for the second light emitting control transistor T5 includes: a conductive connection structure P10 connected to the second electrode d of the second light emitting control transistor T5 through a via.

A conductive connection structure provided for the first reset transistor T6 includes: a conductive connection structure P9 connected to the second electrode d of the first reset transistor T6 through a via.

A conductive connection structure provided for the second reset transistor T7 includes: a conductive connection structure P11 connected to the second electrode d of the second reset transistor T7 through a via.

The conductive connection structure P3 is connected to the conductive connection structure P4; the conductive connection structure P5, the conductive connection structure P8 and the conductive connection structure P9 are connected to each other; the conductive connection structure P7 is connected to the conductive connection structure P6; the conductive connection structure P10 is connected to the conductive connection structure P11; and the conductive connection structure P11 is connected to the first electrode 14 of the light emitting element EL.

Alternatively, as above, the fourth conductive layer 12 includes the conductive connection structures P1 to P11, which is only an alternative embodiment in the present disclosure, and is only exemplary, and does not limit the technical solution of the present disclosure.

Figure 8:
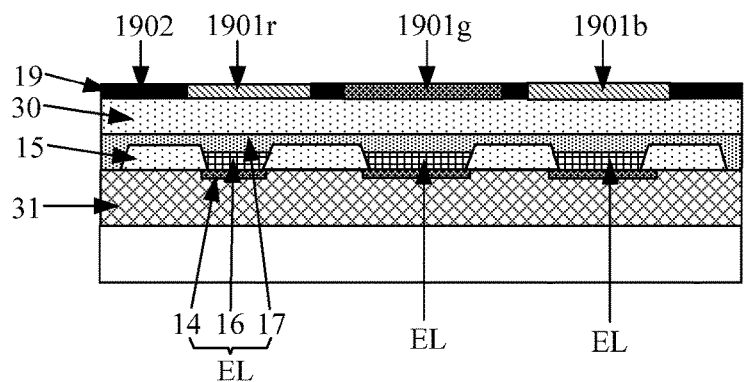
FIG. 8 is a schematic cross-sectional view of a portion of a display substrate according to an embodiment of the present disclosure.

FIG. 8 is another schematic cross-sectional view of a portion of a display substrate according to an embodiment of the present disclosure. As shown in FIG. 8, in some embodiments, the display substrate further includes: an encapsulation layer 30 and a color resist layer 19. The encapsulation layer 30 is located on a side of the second electrode 17 away from the base substrate 1, and is used for encapsulating the light emitting elements; the encapsulation layer 30 may have a single-layer structure or a multi-layer structure in which organic encapsulation layers and inorganic encapsulation layers are alternately stacked. The color resist layer 19 is located on a side of the encapsulation layer 30 away from the base substrate 1, and includes a plurality of color resist patterns 1901r, 1901g, 1901b in a one-to-one correspondence with the electroluminescent patterns 16. Further, the color resist layer 19 may further include a black matrix 1902.

As an example, the light emitting element EL is a white OLED capable of emitting white light, and the plurality of color resist patterns include a red color resist pattern 1901r, a green color resist pattern 1901g, and a blue color resist pattern 1901b, where the white light emitted from the white OLED becomes red after passing through the red color resist pattern 1901r, becomes green after passing through the green color resist pattern 1901g, and becomes blue after passing through the blue color resist pattern 1901b. At this time, the display substrate may be used for color display.

As another example, the plurality of light emitting elements include a red QLED capable of emitting red light, a green QLED emitting green light, and a blue QLED emitting blue light; and the plurality of color resist patterns include a red color resist pattern 1901r corresponding to the red QLED, a green color resist pattern 1901g corresponding to the green QLED, and a blue color resist pattern 1901b corresponding to the blue QLED. The color resist patterns 1901r, 1901g, and 1901b are provided, so that the light extraction purity of each pixel unit can be improved, and thus, the display color gamut of the product can be improved.

Figure 9:
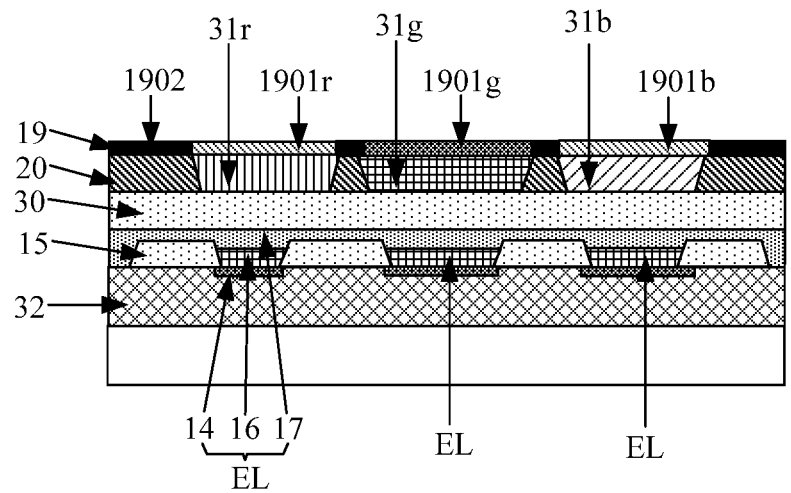
FIG. 9 is a schematic cross-sectional view of a portion of a display substrate according to an embodiment of the present disclosure.

FIG. 9 is another schematic cross-sectional view of a portion of a display substrate according to an embodiment of the present disclosure. As shown in FIG. 9, in some embodiments, a material of the electroluminescent patterns 16 includes an organic light emitting material (i.e., the light emitting element is an OLED), and the display substrate further includes: a light conversion layer located between the encapsulation layer 30 and the color resist layer 19 and including a plurality of light conversion color filters 31r and 31g in a one-to-one correspondence with at least a portion of the electroluminescent patterns 16, wherein the light conversion color filters 31r and 31g are capable of generating light of other color under excitation of light emitted from the light emitting element.

In some embodiments, a material of the light conversion color filters 31r and 31g includes a quantum dot material.

It should be noted that for convenience of description, a structure located between the first electrodes 14 and the base substrate 1 in the embodiment of the present disclosure is referred to as a structure of a driving function layer 32. For the specific structure of the driving function layer 32 located between the first electrodes 14 and the base substrate 1 in FIG. 8 and FIG. 9, reference may be made to the description in the above embodiments, which is not repeated here.

In some embodiments, the display substrate further includes a second pixel defining layer 20 provided with a plurality of second pixel accommodating holes therein in a one-to-one correspondence with the first pixel accommodating holes, and the light conversion color filters are located in the corresponding second pixel accommodating holes. Optionally, a light reflecting metal layer (not shown) may be provided on a sidewall surrounding each second accommodating hole, to increase the amount of light emitted.

As one example, all the light emitting elements EL are OLEDs capable of emitting blue light; the light conversion color filters includes the red light conversion color filter 31r capable of converting blue light into red light and the green light conversion color filter 31g capable of converting blue light into green light; a material of the red light conversion color filter 31r includes a red light quantum dot material, and a material of the green light conversion color filter 31g includes a green light quantum dot material. In addition, a transparent pattern 31b (typically made of a transparent resin material) is disposed in the display substrate and located in a corresponding second pixel accommodating hole, and may transmit blue light therethrough. The color resist layer 19 includes the red color resist pattern 1901r corresponding to the red light conversion color filter 31r, the green color resist pattern 1901g corresponding to the green light conversion color filter 31g, and the blue color resist pattern 1901b corresponding to the transparent pattern 31b. The structure formed by combining the quantum dot materials and the OLEDs is a QD-OLED structure.

Based on the same inventive concept, embodiments of the present disclosure further provide a method for manufacturing a display substrate, where the method may be used to manufacture the display substrate provided in the above embodiments. For the description of the structure of the display substrate, reference may be made to the above embodiments, and details are not repeated here.

Figure 10:
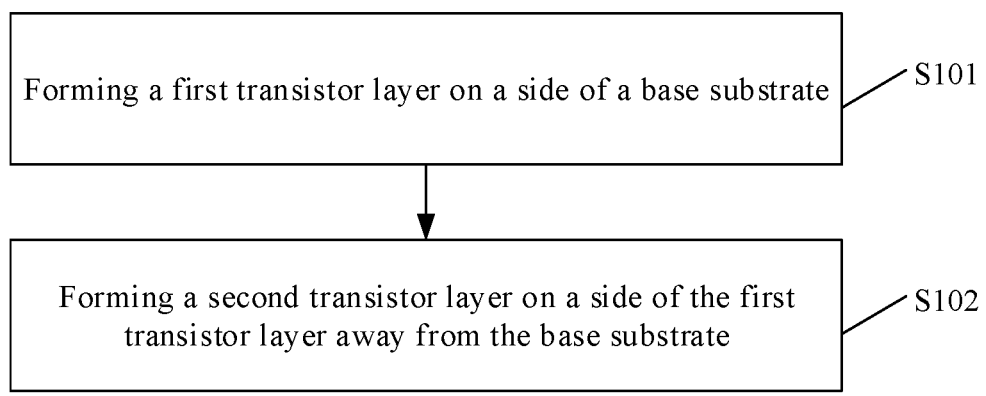
FIG. 10 is a flowchart of a method for manufacturing a display substrate according to an embodiment of the present disclosure.

FIG. 10 is a flowchart of a method for manufacturing a display substrate according to an embodiment of the present disclosure. As shown in FIG. 10, the method for manufacturing a display substrate includes:

Step S101, forming a first transistor layer on a side of a base substrate.

The first transistor layer includes a first active layer, a material of the first active layer includes a low-temperature polysilicon material, and the first active layer includes at least one first channel region and at least one first source-drain doped region.

Step S102, forming a second transistor layer on a side of the first transistor layer away from the base substrate.

The second transistor layer includes a second active layer, and at least one insulating layer is arranged between the first active layer and the second active layer. The second active layer is made of low-temperature polysilicon materials; the second active layer includes at least one second channel region and at least one second source-drain doped region; an orthographic projection of the at least one second source-drain doped region on the base substrate overlaps with an orthographic projection of the at least one first source-drain doped region on the base substrate; and the at least one second source-drain doped region is connected to a corresponding first source-drain doped region through a corresponding connecting part filled in a corresponding first via in the at least one insulating layer.

In the embodiment of the present disclosure, the two transistor layers are stacked and the active layers in the two transistor layers overlap with each other. That is, transistors in each pixel driving circuit may be distributed in the two transistor layers as required, and the source-drain doped regions of at least two transistors in each pixel driving circuit overlap with each other in a direction perpendicular to the base substrate. With this design, an area occupied by each pixel driving circuit on the plane parallel to the base substrate is reduced.

Figure 11:
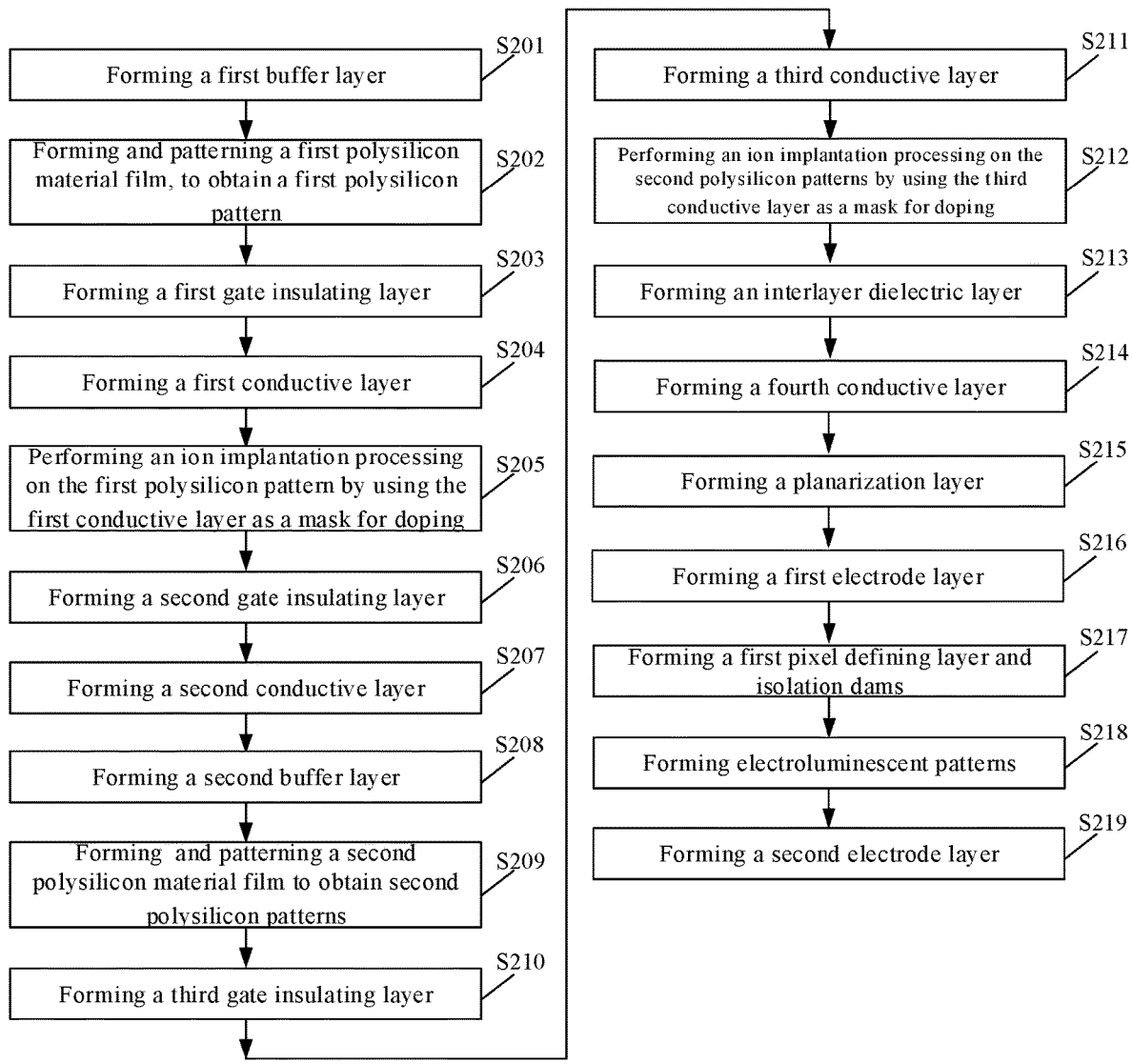
FIG. 11 is a flowchart of a method for manufacturing a display substrate according to an embodiment of the present disclosure.
Figure 12A:
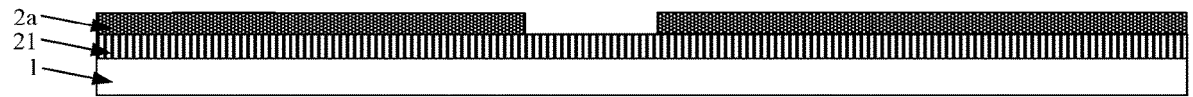
FIGS. 12A to 12N are schematic cross-sectional views of intermediate products during manufacturing a display substrate according to the method of FIG. 11.

FIG. 11 is another flowchart of a method for manufacturing a display substrate according to an embodiment of the present disclosure; FIGS. 12A to 12N are schematic cross-sectional views of intermediate products during manufacturing a display substrate according to the method of FIG. 11. As shown in FIGS. 11 to 12N, the manufacturing method may be used for manufacturing the display substrate shown in FIG. 4, and include:

Step S201, forming a first buffer layer on a side of the base substrate.

A material of the first buffer layer 21 may include at least one of silicon oxide and silicon nitride.

Step S202, forming a first polysilicon material film on a side of the first buffer layer away from the base substrate, and patterning the first polysilicon material film, to obtain a first polysilicon pattern.

Referring to FIG. 12A, in step S202, firstly, an amorphous silicon material film with a thickness in a range of 300 Å to 1000 Å is formed on a side of the first buffer layer 21 away from the base substrate 1; then, a dehydrogenation process and a ELA laser crystallization process is performed in sequence on the amorphous silicon material film, so that the amorphous silicon material film is formed as a polysilicon material film; then, the polysilicon material film is patterned through a patterning process to obtain a first polysilicon pattern 2a.

Step S203, forming a first gate insulating layer on a side of the first polysilicon pattern away from the base substrate.

Step S204, forming a first conductive layer on a side of the first gate insulating layer away from the base substrate.

Figure 12B:
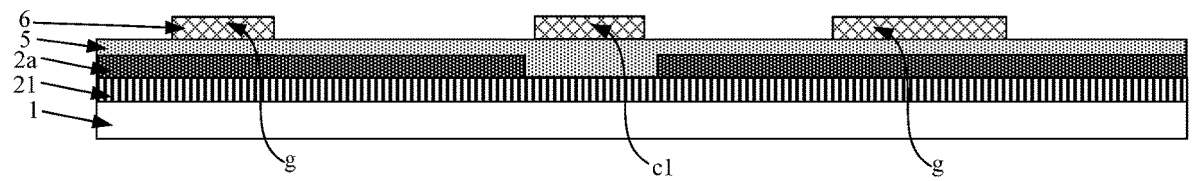

Referring to FIG. 12B, the first conductive layer 6 includes gate electrodes g of respective transistors located in the first transistor layer. Alternatively, the first conductive layer 6 may include other conductive structures, such as the first terminal plate c1 of each capacitor C, gate lines (not shown), a light emitting control signal line (not shown), reset control signal lines (not shown), and the like. Optionally, a material of the first conductive layer 6 may be a metal material (e.g., molybdenum, aluminum, silver, copper, titanium, platinum, tungsten, etc.), a metal alloy, or other conductive materials, which may be selected according to actual requirements.

Step S205, performing an ion implantation process on the first polysilicon pattern by using the first conductive layer as a mask for doping.

Figure 12C:
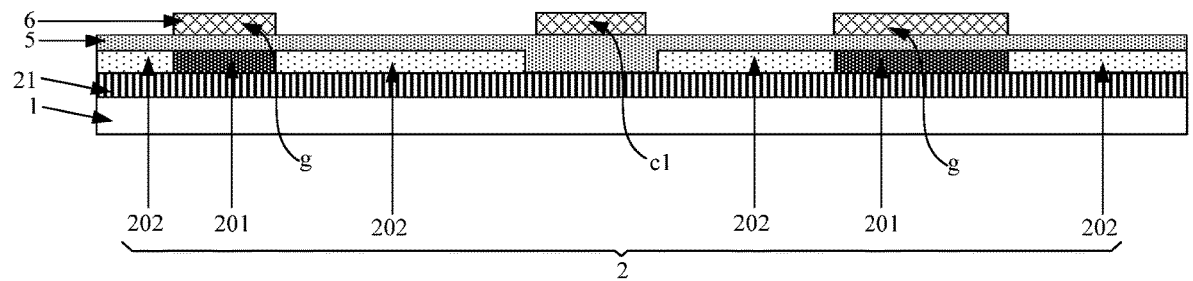

Referring to FIGS. 12B and 12C, a portion of the first polysilicon pattern 2a not covered by the first conductive layer 6 is conductorized as the at least one first source-drain doped region 202, and a portion of the first polysilicon pattern 2a covered by the first conductive layer 6 is used as the at least one first channel region 201, thereby obtaining the first active layer 2.

In the embodiment of the present disclosure, the ion implantation process is performed on the first polysilicon pattern 2a by using the first conductive layer 6 as the mask for doping, so that an additional mask for doping is not required to be manufactured, the production cycle can be effectively shortened, and the production cost can be reduced.

Step S206, forming a second gate insulating layer on a side of the first conductive layer away from the base substrate.

Step S207, forming a second conductive layer on a side of the second gate insulating layer away from the base substrate.

Figure 12D:
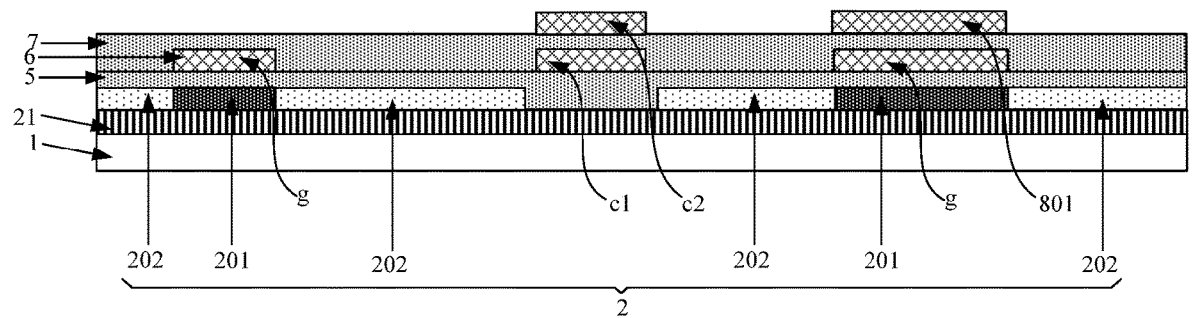

Referring to FIG. 12D, the second conductive layer 8 may include second terminal plates c2 of the capacitors C, a shielding electrode pattern 801, a reset voltage transmission line (not shown), and the like. A material of the second conductive layer 8 may be a metal material, a metal alloy, or other conductive material.

Step S208, forming a second buffer layer on a side of the second conductive layer away from the base substrate.

Figure 12E:
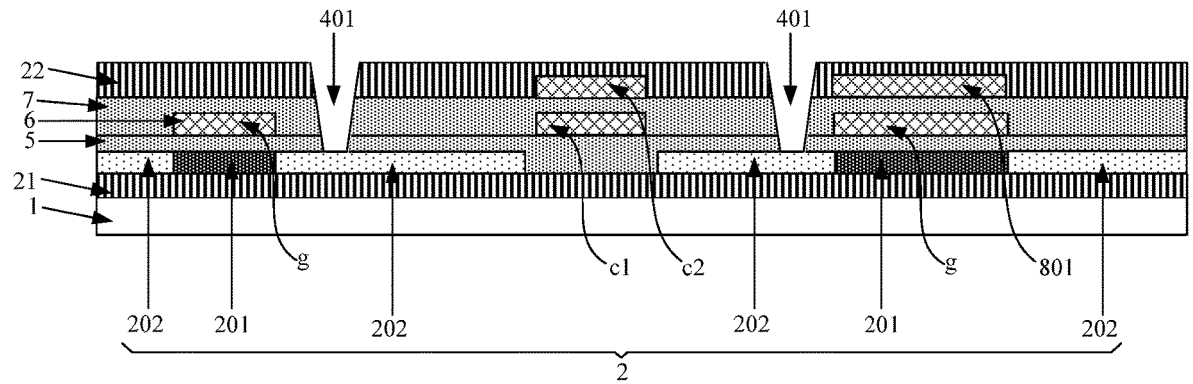

Referring to FIG. 12E, a second buffer material film is formed on a side of the second conductive layer 8 away from the base substrate 1; and then the second buffer material film, the second gate insulating layer 7 and the first gate insulating layer 5 are patterned through a patterning process to form first vias 401.

A material of the second buffer layer 22 may include at least one of silicon oxide, silicon nitride, and aluminum oxide. In some embodiments, a thickness of the second buffer layer 22 is in a range of 1200 Å to 10000 Å. In the embodiment of the present disclosure, the second buffer layer 22 is disposed, which can effectively improve the crystallization effect in the subsequent process for forming the second active layer.

Step 209, forming a second polysilicon material film on a side of the second buffer layer away from the base substrate, and patterning the second polysilicon material film to obtain second polysilicon patterns.

Figure 12F:
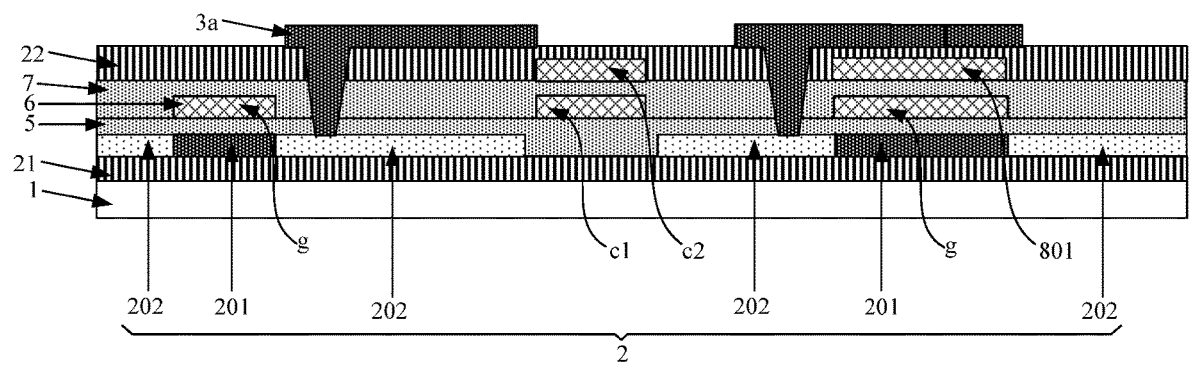

Referring to FIG. 12F, in step S202, firstly, an amorphous silicon material film is formed on a side of the second buffer layer 22 away from the base substrate 1; then, a dehydrogenation process and a ELA laser crystallization process is performed in sequence on the amorphous silicon material film, so that the amorphous silicon material film is formed as a polysilicon material film; then, the polysilicon material film is patterned through a patterning process to obtain second polysilicon patterns 3a, each of which is filled in a corresponding first via 401.

Step S210, forming a third gate insulating layer on a side of the second polysilicon patterns away from the base substrate.

Step S211, forming a third conductive layer on a side of the third gate away from the base substrate.

Figure 12G:
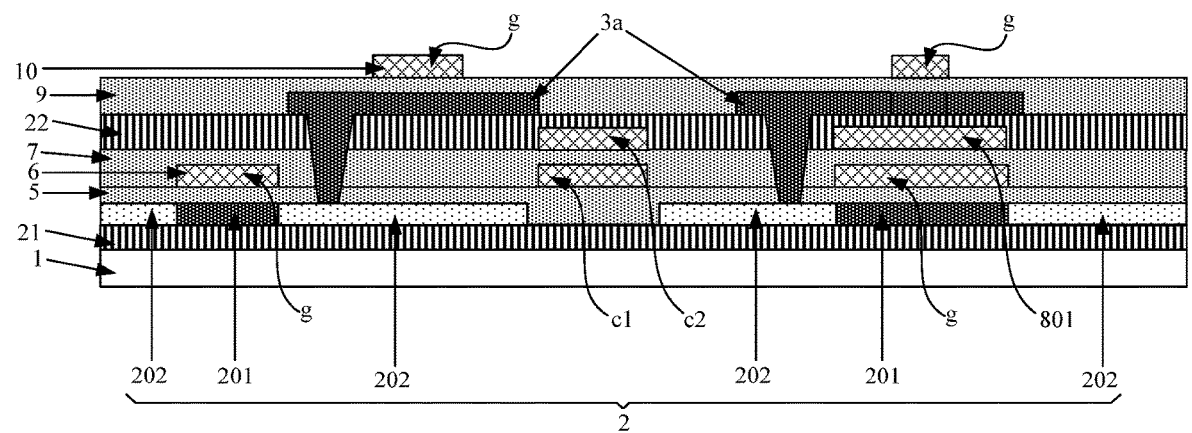

Referring to FIG. 12G, the third conductive layer 10 includes gate electrodes g of respective transistors located in the second transistor layer. Alternatively, the third conductive layer 10 may include other conductive structures, such as gate lines (not shown), a light emitting control signal line (not shown), reset control signal lines (not shown), and the like. Optionally, a material of the third conductive layer 10 may be a metal material, a metal alloy, or other conductive materials.

Step S212, performing an ion implantation process on the second polysilicon patterns by using the third conductive layer as a mask for doping.

Figure 12H:
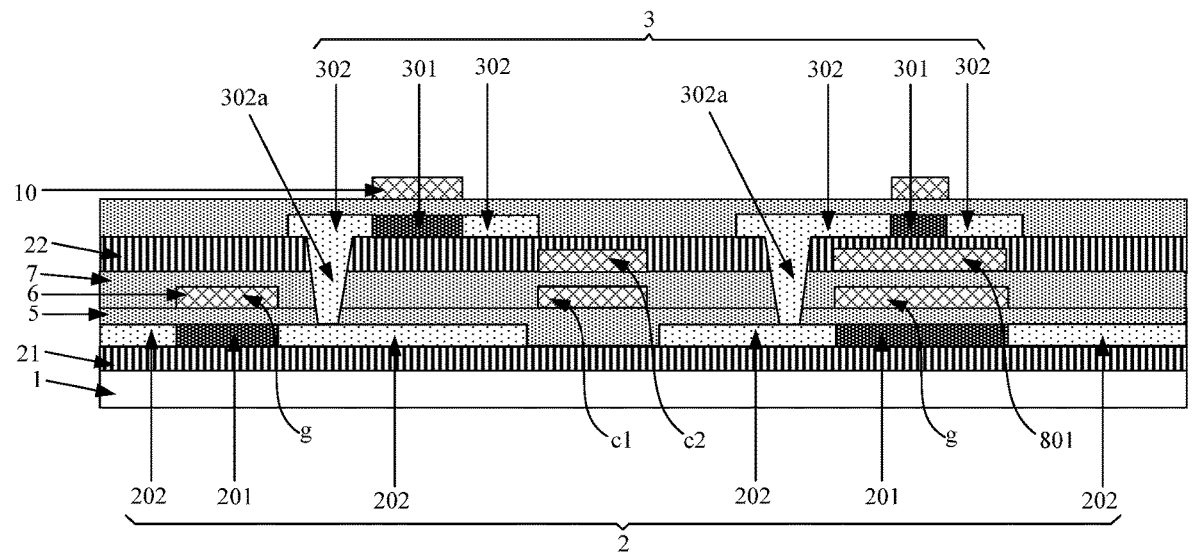

Referring to FIGS. 12G and 12H, portions of the second polysilicon patterns 3a not covered by the third conductive layer 10 are conductorized as the at least one second source-drain doped region 302 and the connecting parts 302a, and portions of the second polysilicon patterns 3a covered by the third conductive layer 10 are used as the at least one second channel region 301, thereby obtaining the first active layer 2.

In the embodiment of the present disclosure, the ion implantation process is performed on the second polysilicon patterns by using the third conductive layer 10 as the mask for doping, so that an additional mask for doping is not required to be manufactured, the production cycle can be effectively shortened, and the production cost can be reduced.

In some embodiments, considering that portions of the second polysilicon patterns 3*a* located in vias have a greater thickness, in order to ensure the conductivity of the portions of the second polysilicon patterns 3*a* located in the vias, the ion implantation process may be performed several times, so that each of the connecting parts 302*a* formed by conductorizing portions of the second polysilicon patterns 3*a* located in the first vias has at least two doping concentration centers in the direction perpendicular to the base substrate 1. Specifically, the ion implantation depth can be adjusted by changing the ion beam energy of the ion implantation. Generally, the higher the ion beam energy is, the deeper the ion implantation depth is, and the deeper the resulting dopant concentration centers are, without considering other factors.

Optionally, the ion beam energy for the ion implantation in the ion implantation processing is in a range of 5 KeV to 90 KeV, such as 5 KeV, 15 KeV, 25 KeV, 35 KeV, 45 KeV, 55 KeV, 65 KeV, 75 KeV, 85 KeV, 90 KeV; an ion beam dosage for the ion implantation is in a range of $10^{17}/cm^2$ to $10^{22}/cm^2$, such as $10^{17}/cm^2$, $10^{18}/cm^2$, $10^{19}/cm^2$, $10^{20}/cm^2$, $10^{21}/cm^2$, $10^{22}/cm^2$.

Step S213, forming an interlayer dielectric layer on a side of the third conductive layer away from the base substrate.

Figure 12I:
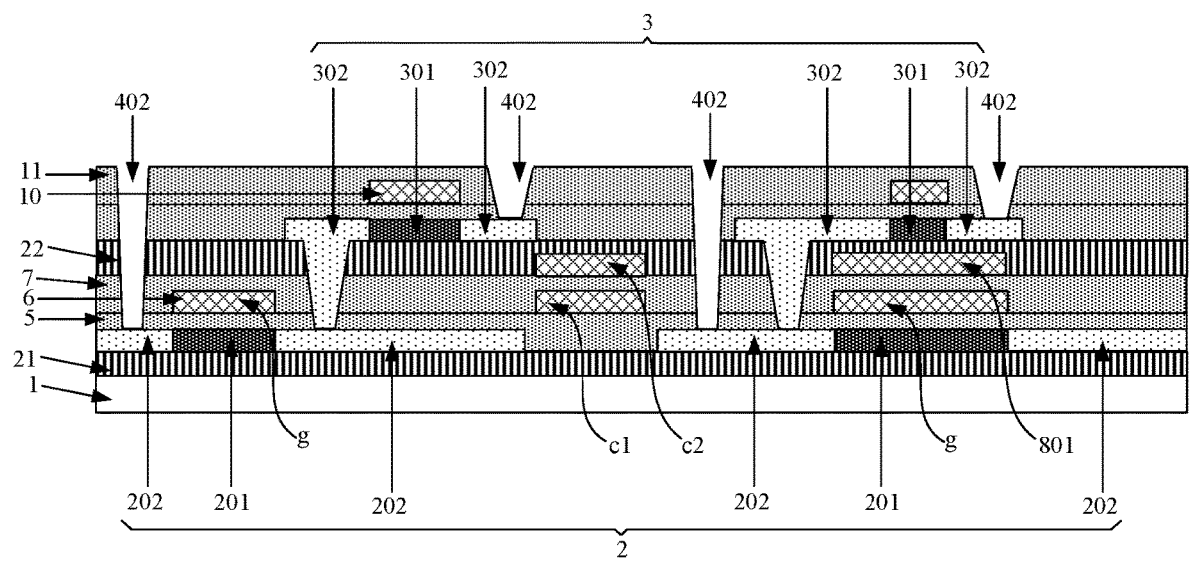

Referring to FIG. 12I, an interlayer dielectric material film is formed firstly, and then the interlayer dielectric material film is patterned to form second vias 402 at designed positions, which may extend to a corresponding structure (for example, gate electrodes or source-drain doped regions of some transistors or the like), and obtain a pattern of the interlayer dielectric layer 11.

Step S214, forming a fourth conductive layer on a side of the interlayer dielectric layer away from the base substrate.

Figure 12J:
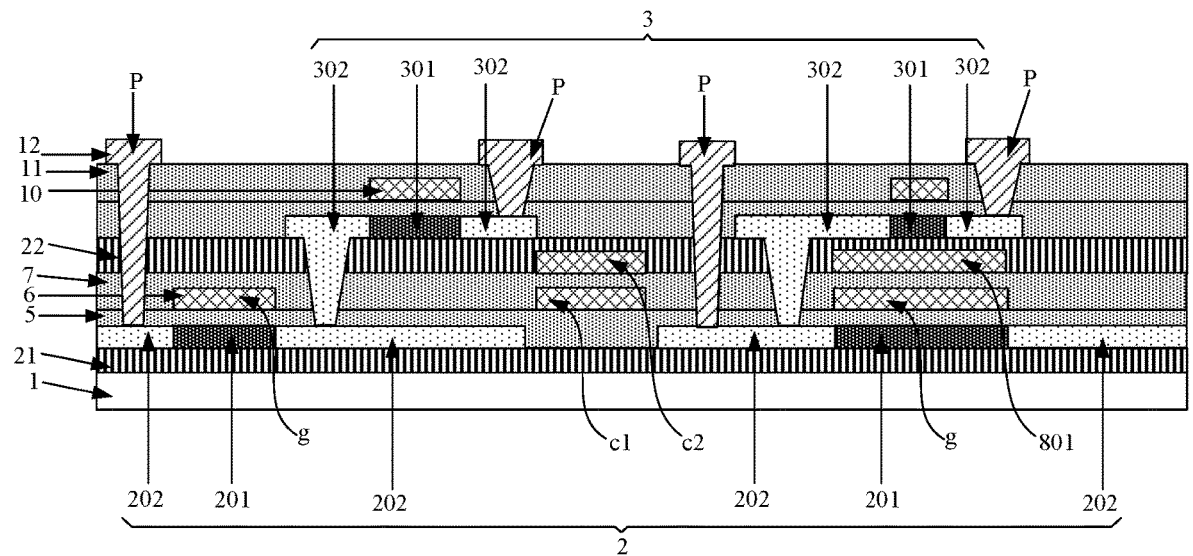

Referring to FIG. 12J, the fourth conductive layer 12 includes data lines (not shown) and conductive connection structures P. Alternatively, the fourth conductive layer 12 may include other conductive structures, such as an operating voltage transmission line (not shown) and the like. Optionally, a material of the fourth conductive layer 12 may be a metal material, a metal alloy, or other conductive materials, which may be selected according to actual requirements.

Step S215, forming a planarization layer on a side of the fourth conductive layer away from the base substrate.

Figure 12K:
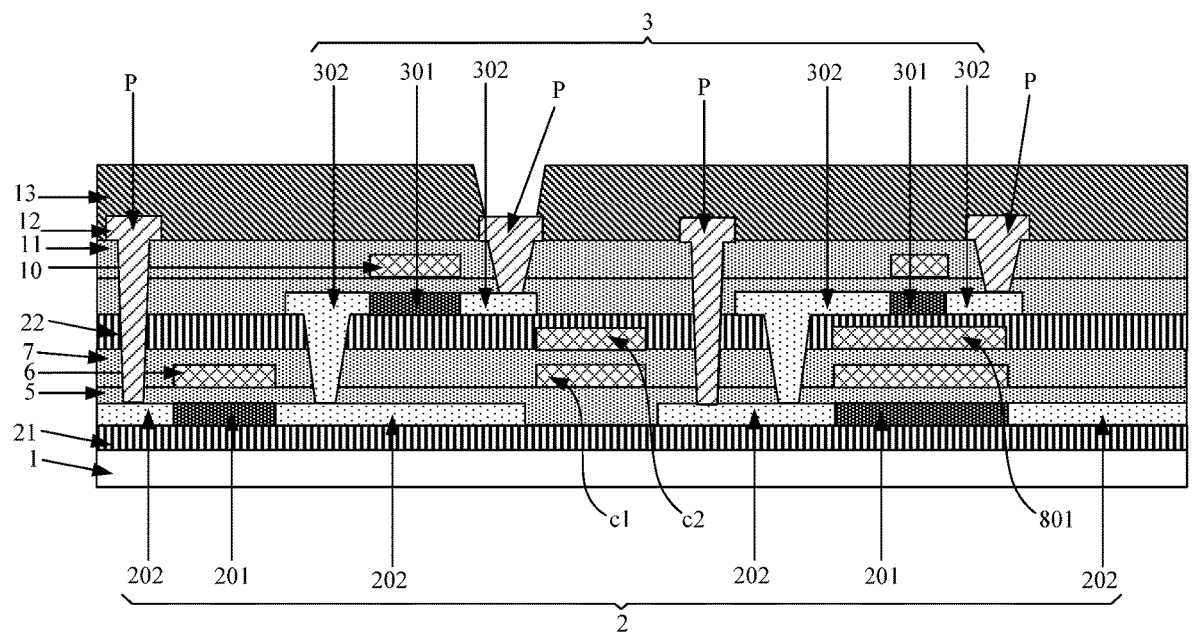

Referring to FIG. 12K, a planarization material film is firstly formed, and then patterned through a patterning process, to obtain the planarization layer 13. The planarization layer 13 may be made of an organic resin material, and have a thickness in a range of 1 μm to 3 μm.

Step S216, forming a first electrode layer on the planarization layer away from the base substrate.

Figure 12L:
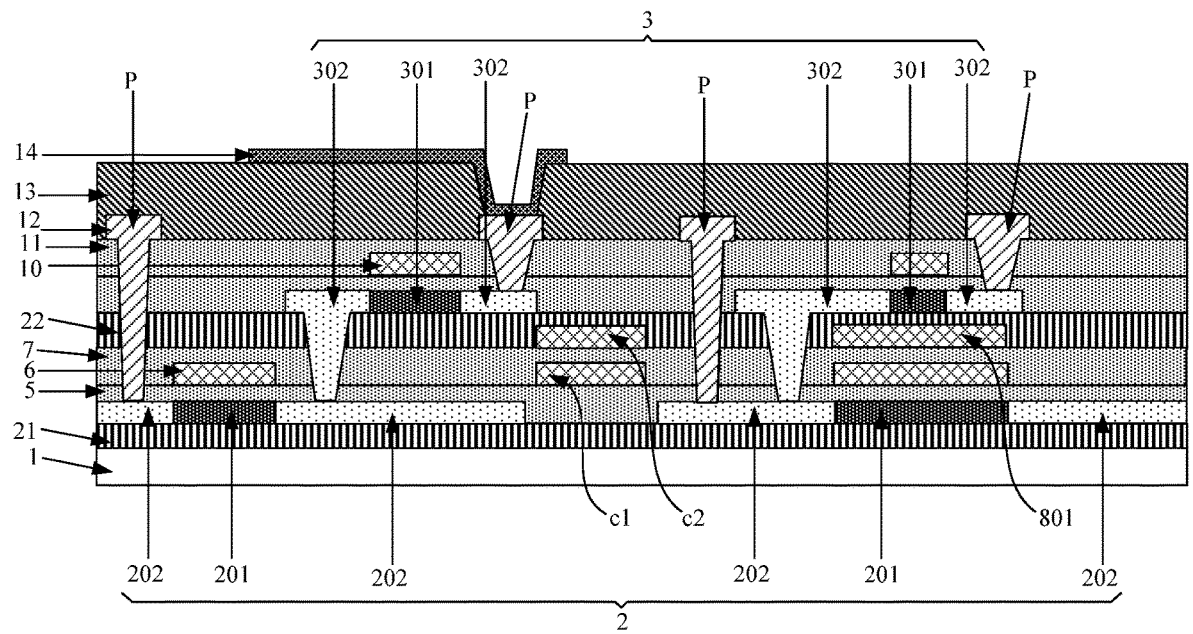

Referring to FIG. 12L, the first electrode layer includes the first electrodes 14. Optionally, a material of the first electrode layer may be a metal material, a metal alloy, or other conductive materials, which may be selected according to actual requirements.

Step S217, forming a first pixel defining layer and isolation dams on a side of the first electrode layer away from the base substrate.

Figure 12M:
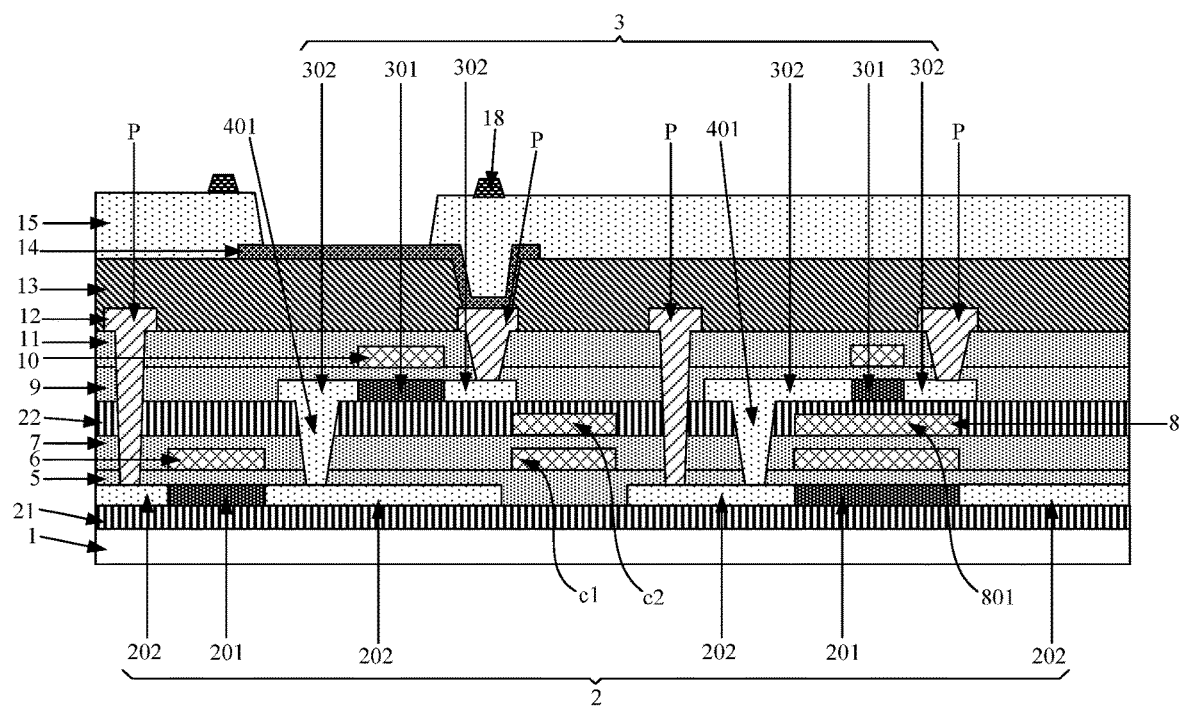
Figure 12N:
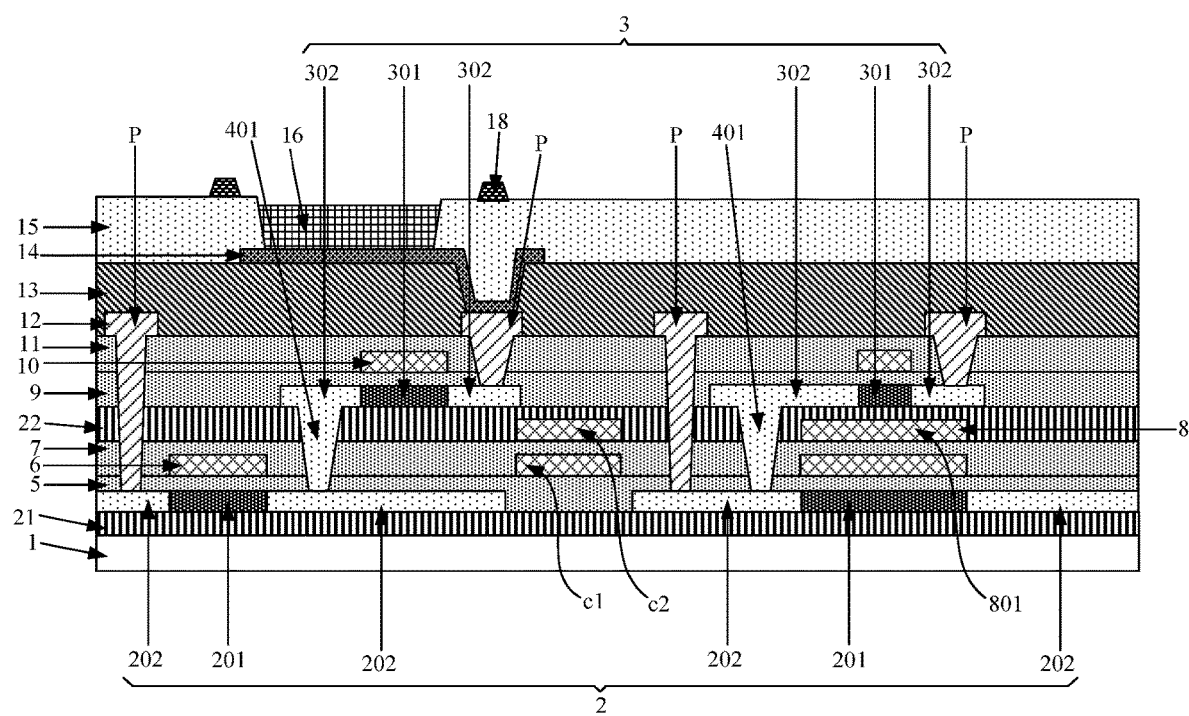

Referring to FIG. 12M, first pixel accommodating holes are formed in the first pixel defining layer 15. The first pixel defining layer 15 may be made of an organic resin material, and have a thickness in a range of 1 μm to 3 μm.

Each isolation dam 18 is disposed between any adjacent pixel openings, and is used to support a mask in a process of depositing light emitting patterns into the pixel openings and to avoid color mixing.

Step S218, forming an electroluminescent pattern in each first pixel accommodating hole.

Referring to FIG. 12N, each light emitting pattern is located in a corresponding first pixel accommodating hole; a material of the electroluminescent pattern 16 may be an organic light emitting material, or may be a quantum dot material.

Step S219, forming a second electrode layer on a side of each electroluminescent pattern away from the base substrate.

Referring to FIG. 4, the second electrode layer includes a second electrode 17, and the second electrode 17 is a planar electrode. A material of the second electrode 17 may be a transparent conductive material, such as indium tin oxide, indium gallium zinc oxide, or the like.

Figure 13:
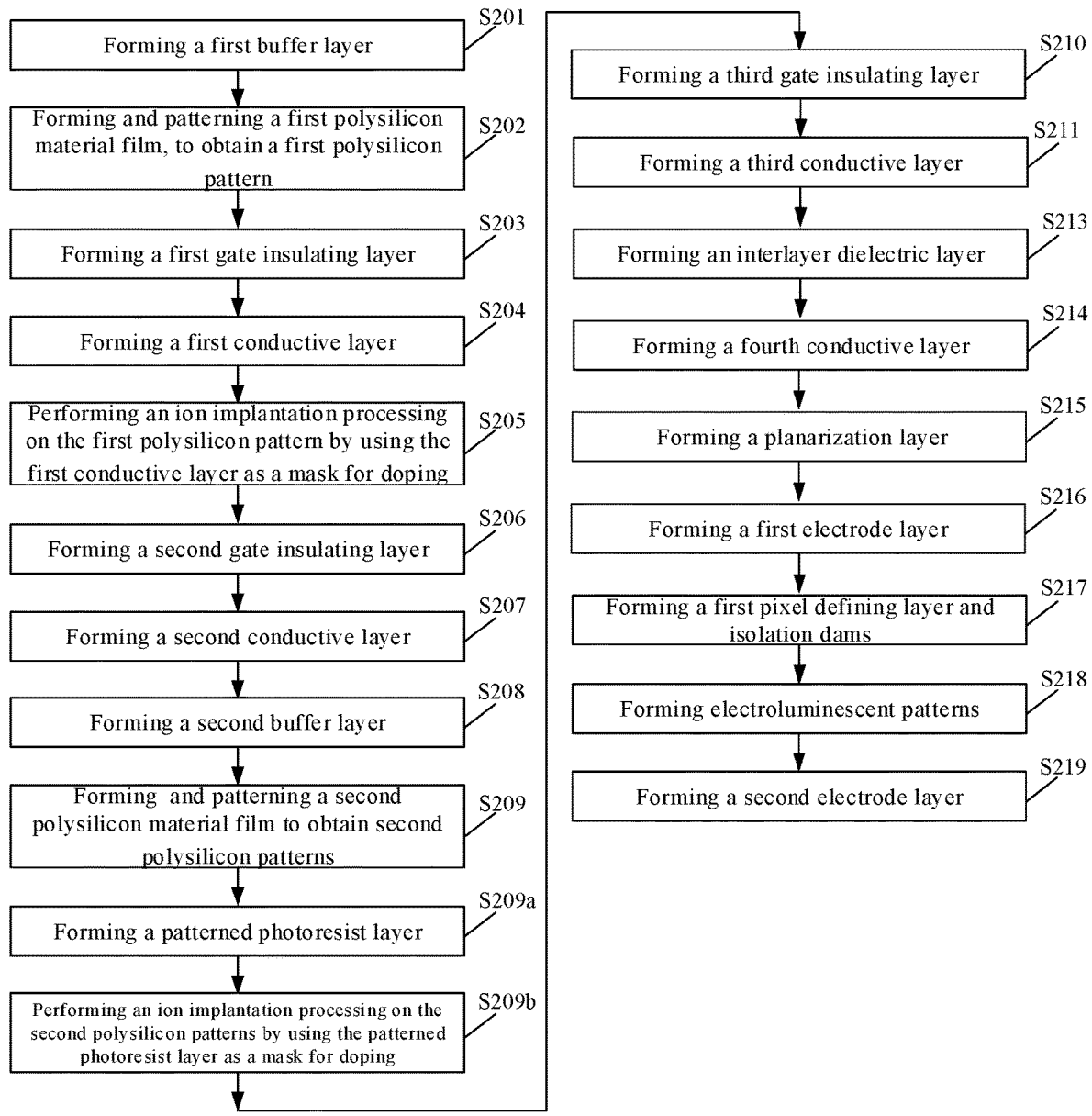
FIG. 13 is a flowchart of a method for manufacturing a display substrate according to an embodiment of the present disclosure.
Figure 14A:
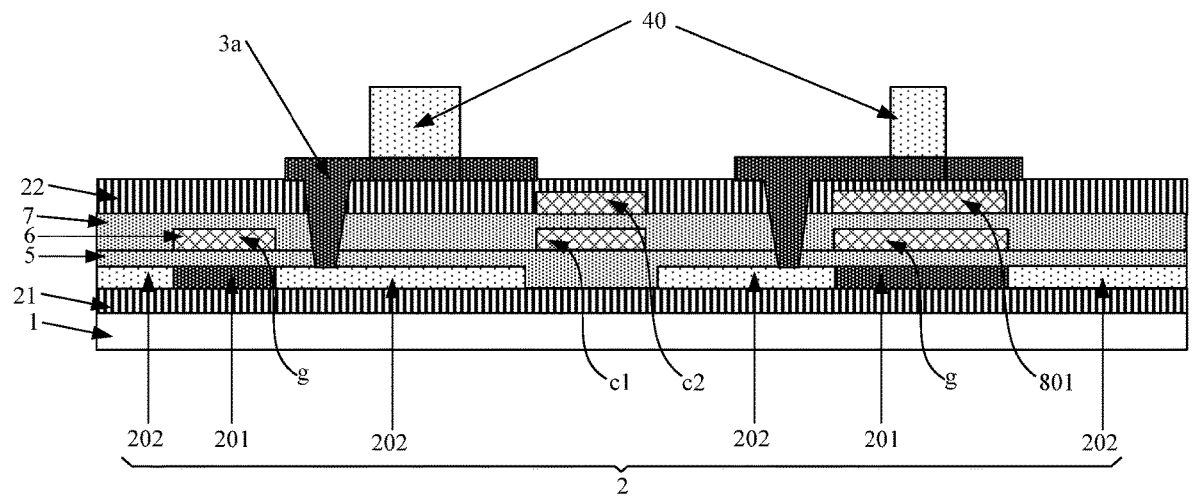
FIGS. 14A to 14B are cross-sectional views illustrating an ion implantation process using a patterned photoresist layer.
Figure 14B:
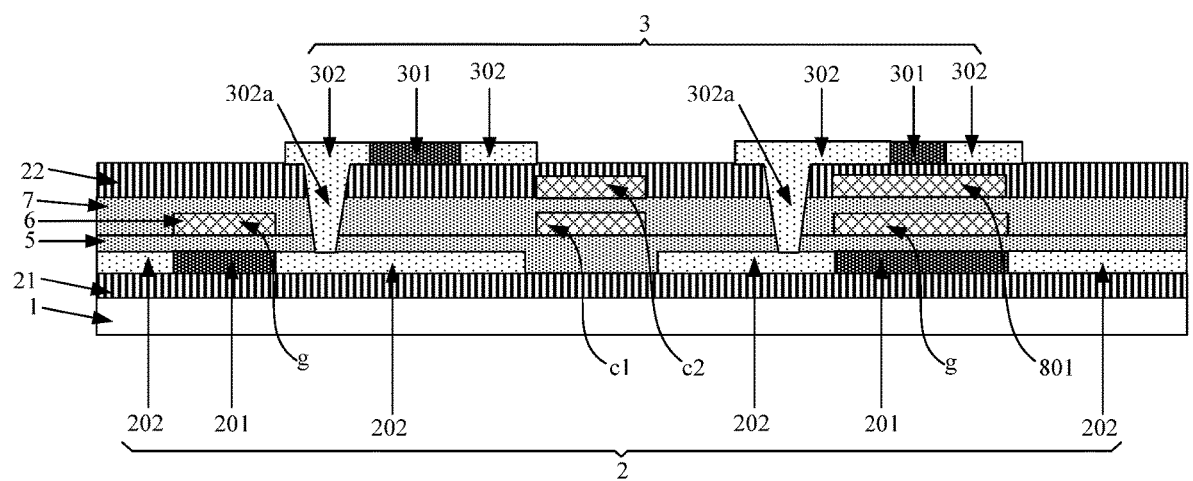

FIG. 13 is another flowchart of a method for manufacturing a display substrate according to an embodiment of the present disclosure; and FIGS. 14A to 14B are cross-sectional views illustrating an ion implantation process using a patterned photoresist layer. As shown in FIG. 13, the flowchart provided in FIG. 13 includes steps S201 to S209 in FIG. 12, a new step S209*a*, a new step S209*b*, and steps S210, S211, and S213 to S219 in FIG. 12. For the specific description of step S201 to step S209, step S210, step S211, step S213 to step S219, reference may be made to the description of the flowchart shown in FIG. 12, and details are not repeated here. Only the new steps S209*a* and S209*b* will be described in detail below.

Step S209*a*, forming a patterned photoresist layer on a side of the second polysilicon patterns away from the base substrate.

Referring to FIG. 14A, firstly, a photoresist layer is coated on a side of the second polysilicon patterns 3*a* away from the base substrate 1, and then the photoresist layer is patterned through exposure, masking and developing processes to obtain the patterned photoresist layer 40; wherein the patterned photoresist layer 40 covers a region where the at least one second channel region is to be formed subsequently and exposes a region where the at least one second source-drain doped region and connecting parts are to be formed subsequently.

It should be noted that a photoresist used in the photoresist layer in the embodiment of the present disclosure may be a positive photoresist or a negative photoresist, which is not limited in the present disclosure.

Step S209*b*, performing an ion implantation process on the second polysilicon patterns 3*a* by using the patterned photoresist layer as a mask for doping.

Referring to FIGS. 14A and 14B, during the ion implantation process, portions of the second polysilicon patterns 3*a* not covered by the patterned photoresist layer are conductorized as the at least one second source-drain doped region 302 and connecting parts 302*a*, and portions of the second polysilicon patterns 3*a* covered by the patterned photoresist layer are used as the at least one second channel region 301, so as to obtain the second active layer 3. After the second active layer 3 is formed, the patterned photoresist layer 40 is stripped through a stripping process.

In some embodiments, considering that portions of the second polysilicon patterns 3*a* located in vias have a greater thickness, in order to ensure the conductivity of the portions of the second polysilicon patterns 3*a* located in the vias, the ion implantation process may be performed several times, so that each of the connecting parts 302a formed by conductorizing portions of the second polysilicon patterns 3a located in the first vias 401 has at least two doping concentration centers in the direction perpendicular to the base substrate 1. For the description of the ion implantation process being performed several times, reference may be made to the above embodiments, and details are not described herein again.

It should be noted that in the embodiment of the present disclosure, when forming the first active layer 2, the ion implantation process may be performed by using the patterned photoresist layer as the mask for doping as shown in step S209a and step S209b, instead of using the first conductive layer 6 as the mask for doping.

Based on the same inventive concept, the embodiment of the present disclosure further provides a display apparatus, which includes the display substrate in any of the above embodiments. It should be noted that the display apparatus provided in this embodiment may be: any product or component with a display function, such as a flexible wearable device, a mobile phone, a tablet computer, a television, a display, a notebook computer, a digital photo frame, a navigator or the like. Other essential components of the display apparatus are understood by one of ordinary skill in the art to be included, and are not described herein or should not limit the present disclosure.

Further, the display apparatus may also include various types of display apparatuses, such as a liquid crystal display apparatus, an organic electroluminescent display apparatus (e.g., an OLED display apparatus, a QLED display apparatus, a QD-OLED display apparatus), which is not limited here.

It should be understood that the above embodiments are merely exemplary embodiments adopted to explain the principles of the present disclosure, and the present disclosure is not limited thereto. It will be apparent to one of ordinary skill in the art that various changes and modifications may be made therein without departing from the spirit and scope of the present disclosure, and such changes and modifications also fall within the scope of the present disclosure.

What is claimed is:

1. A display substrate, comprising: a base substrate, and a first transistor layer and a second transistor layer sequentially arranged along a direction away from the base substrate;
    wherein the first transistor layer comprises a first active layer; the second transistor layer comprises a second active layer, and at least one insulating layer is arranged between the first active layer and the second active layer;
    the first active layer and the second active layer both are made of low-temperature polysilicon materials; the first active layer comprises at least one first channel region and at least one first source-drain doped region; the second active layer comprises at least one second channel region and at least one second source-drain doped region;
    an orthographic projection of the at least one second source-drain doped region on the base substrate overlaps with an orthographic projection of the at least one first source-drain doped region on the base substrate; and
    the at least one second source-drain doped region is connected to a corresponding first source-drain doped region through a corresponding connecting part filled in a corresponding first via in the at least one insulating layer;
    the display substrate comprises a plurality of pixel units on the base substrate, each of which comprises a light emitting element and a pixel driving circuit for driving the light emitting element;
    the pixel driving circuit comprises: a driving transistor configured to output a driving current to the light emitting element according to a gate-source voltage of the driving transistor;
    the pixel driving circuit further comprises a first light emitting control transistor;
    a gate electrode of the first light emitting control transistor is electrically connected to a light emitting control signal line, a first electrode of the first light emitting control transistor is electrically connected to an operating voltage transmission line, and a second electrode of the first light emitting control transistor is electrically connected to a first electrode of the driving transistor; and
    the first light emitting control transistor is in the second transistor layer, and a channel region and a source-drain doped region of the first light emitting control transistor are in the second active layer.

2. The display substrate of claim 1, wherein a material of the connecting part comprises at least two types of silicon with different crystallinities and doping ions for conductorization.

3. The display substrate of claim 2, wherein the at least two types of silicon with different crystallinities comprise: amorphous silicon and polysilicon.

4. The display substrate of claim 2, wherein the connecting part has at least two doping concentration centers in a direction perpendicular to the base substrate.

5. The display substrate of claim 1, wherein a slope angle of the first via is in a range of 30° to 75°.

6. The display substrate of claim 1, wherein an orthographic projection of the at least one first channel region on the base substrate overlaps with an orthographic projection of the at least one second channel region on the base substrate.

7. The display substrate of claim 6, wherein a shielding electrode pattern is arranged between the first active layer and the second active layer; and
    an orthographic projection of the shielding electrode pattern on the base substrate covers a region where the orthographic projections of the at least one first channel region and the at least one second channel region on the base substrate overlap with each other.

8. The display substrate of claim 1, wherein the first transistor layer further comprises:
    a first gate insulating layer on a side of the first active layer away from the base substrate; and
    a first conductive layer on a side of the first gate insulating layer away from the base substrate, and comprising gate electrodes of respective transistors located in the first transistor layer and corresponding to the at least one first channel region.

9. The display substrate of claim 8, wherein the first conductive layer further comprises: a first terminal plate of a capacitor;
    the first transistor layer further comprises:
    a second gate insulating layer on a side of the first conductive layer away from the base substrate; and
    a second conductive layer on a side of the second gate insulating layer away from the base substrate and comprising a second terminal plate of the capacitor opposite to the first terminal plate of the capacitor.

10. The display substrate of claim 1, wherein the display substrate further comprises:
an interlayer dielectric layer on a side of the second transistor layer away from the base substrate; and
a fourth conductive layer on a side of the interlayer dielectric layer away from the base substrate;
wherein the fourth conductive layer comprises: data lines and conductive connection structures, wherein each of the conductive connection structures is connected to a corresponding first source-drain doped region or a corresponding second source-drain doped region through a corresponding via.

11. The display substrate of claim 10, wherein the display substrate further comprises:
a planarization layer on a side of the fourth conductive layer away from the base substrate;
a first electrode layer on a side of the planarization layer away from the base substrate and comprising a plurality of first electrodes, each of which is connected to a corresponding conductive connection structure through a corresponding via to be electrically connected to a corresponding first source-drain doped region or a corresponding second source-drain doped region;
a first pixel defining layer on a side of the first electrode layer away from the base substrate, wherein a plurality of first pixel accommodating holes are formed in the first pixel defining layer, and each of the plurality of first electrodes is exposed through a corresponding first pixel accommodating hole;
a light emitting layer comprising a plurality of electroluminescent patterns each of which is in a corresponding first pixel accommodating hole; and
a second electrode layer on a side of the first pixel defining layer away from the base substrate.

12. The display substrate of claim 1,
wherein the driving transistor is in the first transistor layer, and a channel region and a source-drain doped region of the driving transistor are in the first active layer.

13. The display substrate of claim 12, wherein the pixel driving circuit further comprises: a data writing transistor, a threshold compensation transistor, a first reset transistor, a second reset transistor, a second light emitting control transistor and a capacitor;
a gate electrode of the data writing transistor is electrically connected to a corresponding gate line, a first electrode of the data writing transistor is electrically connected to a corresponding data line, and a second electrode of the data writing transistor is electrically connected to the first electrode of the driving transistor;
a gate electrode of the threshold compensation transistor is electrically connected to a corresponding gate line, a first electrode of the threshold compensation transistor is electrically connected to a second electrode of the driving transistor, and a second electrode of the threshold compensation transistor is electrically connected to a gate electrode of the driving transistor;
a gate electrode of the first reset transistor is electrically connected to a corresponding reset control signal line, a first electrode of the first reset transistor is electrically connected to a reset voltage transmission line, and a second electrode of the first reset transistor is electrically connected to the gate electrode of the driving transistor;
a gate electrode of the second reset transistor is electrically connected to a corresponding reset control signal line or a corresponding gate line, a first electrode of the second reset transistor is electrically connected to the reset voltage transmission line, and a second electrode of the second reset transistor is electrically connected to a first electrode of the light emitting element;
a gate electrode of the second light emitting control transistor is electrically connected to the light emitting control signal line, a first electrode of the second light emitting control transistor is connected to the second electrode of the driving transistor, and a second electrode of the second light emitting control transistor is electrically connected to the first electrode of the light emitting element; and
a first terminal plate of the capacitor is connected to the gate electrode of the driving transistor, and a second terminal plate of the capacitor is connected to the operating voltage transmission line.

14. The display substrate of claim 13, wherein the data writing transistor is in the first transistor layer, and a channel region and a source-drain doped region of the data writing transistor are in the first active layer;
the threshold compensation transistor is in the first transistor layer, and a channel region and a source-drain doped region of the threshold compensation transistor are in the first active layer;
the first reset transistor is in the first transistor layer, and a channel region and a source-drain doped region of the first reset transistor are in the first active layer;
the second reset transistor is in the second transistor layer, and a channel region and a source-drain doped region of the second reset transistor are in the second active layer; and
the second light emitting control transistor is in the second transistor layer, and a channel region and a source-drain doped region of the second light emitting control transistor are in the second active layer.

15. A display apparatus, comprising: the display substrate of claim 1.

16. A method for manufacturing a display substrate, wherein the display substrate is the display substrate of claim 1, and the method comprises:
forming a first transistor layer on a side of a base substrate; wherein the first transistor layer comprises a first active layer, a material of the first active layer comprises a low-temperature polysilicon material, and the first active layer comprises at least one first channel region and at least one first source-drain doped region; and
forming a second transistor layer on a side of the first transistor layer away from the base substrate; wherein the second transistor layer comprises a second active layer, and at least one insulating layer is arranged between the first active layer and the second active layer; the second active layer is made of low-temperature polysilicon materials; the second active layer comprises at least one second channel region and at least one second source-drain doped region; an orthographic projection of the at least one second source-drain doped region on the base substrate overlaps with an orthographic projection of the at least one first source-drain doped region on the base substrate; and the at least one second source-drain doped region is connected to a corresponding first source-drain doped region through a corresponding connecting part filled in a corresponding first via in the at least one insulating layer.

17. The method of claim 16, wherein the forming a first transistor layer comprises:

forming a first polysilicon material film on a side of the base substrate, and patterning the first polysilicon material film, to obtain a first polysilicon pattern;

forming a first gate insulating layer on a side of the first polysilicon pattern away from the base substrate;

forming a first conductive layer on a side of the first gate insulating layer away from the base substrate; wherein the first conductive layer comprises gate electrodes of respective transistors in the first transistor layer; and performing an ion implantation on the first polysilicon pattern by using the first conductive layer as a mask for doping;

wherein a portion of the first polysilicon pattern not covered by the first conductive layer is conductorized as the at least one first source-drain doped region, and a portion of the first polysilicon pattern covered by the first conductive layer is used as the at least one first channel region.

18. The method of claim 16, wherein the forming a second transistor layer comprises:

forming a second polysilicon material film on a side of the first transistor layer away from the base substrate, and patterning the second polysilicon material film to obtain second polysilicon patterns, each of which is filled in a corresponding first via;

forming a third gate insulating layer on a side of the second polysilicon patterns away from the base substrate;

forming a third conductive layer on a side of the third gate away from the base substrate; wherein the third conductive layer comprises gate electrodes of respective transistors in the second transistor layer; and performing an ion implantation on the second polysilicon patterns by using the third conductive layer as a mask for doping;

wherein portions of the second polysilicon patterns not covered by the third conductive layer are conductorized as the at least one second source-drain doped region and the connecting parts, and portions of the second polysilicon patterns covered by the third conductive layer are used as the at least one second channel region.

19. The method of claim 18, wherein the performing an ion implantation on the second polysilicon patterns comprises:

performing the ion implantation several times, so that each of the connecting parts formed by conductorizing portions of the second polysilicon patterns filled in the first vias has at least two doping concentration centers in the direction perpendicular to the base substrate.

20. The method of claim 16, wherein the forming a second transistor layer comprises:

forming a second polysilicon material film on a side of the first transistor layer away from the base substrate, and patterning the second polysilicon material film to obtain second polysilicon patterns, each of which is filled in a corresponding first via;

forming a patterned photoresist layer on a side of the second polysilicon patterns away from the base substrate; wherein the patterned photoresist layer covers a region where the at least one second channel region is to be formed subsequently and exposes a region where the at least one second source-drain doped region and connecting parts are to be formed subsequently; and performing an ion implantation on the second polysilicon patterns by using the patterned photoresist layer as a mask for doping;

wherein portions of the second polysilicon patterns not covered by the patterned photoresist layer are conductorized as the at least one second source-drain doped region and connecting parts, and portions of the second polysilicon patterns covered by the patterned photoresist layer are used as the at least one second channel region.

* * * * *